US012579837B2

(12) United States Patent
Lee et al.

(10) Patent No.: US 12,579,837 B2
(45) Date of Patent: Mar. 17, 2026

(54) FINGERPRINT SENSOR AND DISPLAY DEVICE INCLUDING THE SAME

(71) Applicant: Samsung Display Co., Ltd., Yongin-Si (KR)

(72) Inventors: Won Jun Lee, Yongin-si (KR); Chol Ho Kim, Yongin-si (KR); Sang Yun Lim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/774,932

(22) Filed: Jul. 17, 2024

(65) Prior Publication Data

US 2025/0157247 A1 May 15, 2025

(30) Foreign Application Priority Data

Nov. 10, 2023 (KR) ........................ 10-2023-0155574

(51) Int. Cl.
*G06V 40/13* (2022.01)
*H10K 59/131* (2023.01)
*H10K 59/60* (2023.01)

(52) U.S. Cl.
CPC ....... *G06V 40/1318* (2022.01); *H10K 59/131* (2023.02); *H10K 59/60* (2023.02)

(58) Field of Classification Search
None
See application file for complete search history.

(56) References Cited

U.S. PATENT DOCUMENTS

| | | | |
|---|---|---|---|
| 7,218,048 B2 | 5/2007 | Choi et al. | |
| 7,977,126 B2 | 7/2011 | Lee et al. | |
| 10,275,094 B2 | 4/2019 | Kim et al. | |
| 11,087,679 B2 | 8/2021 | Lim et al. | |
| 11,543,904 B2 | 1/2023 | Bok et al. | |
| 2006/0256093 A1* | 11/2006 | Furukawa | G06F 3/042 |
| | | | 345/173 |
| 2010/0039406 A1* | 2/2010 | Lee | G06F 3/044 |
| | | | 345/87 |
| 2020/0119061 A1* | 4/2020 | Oh | H10K 59/60 |
| 2022/0165834 A1* | 5/2022 | Jo | H10K 59/60 |
| 2022/0336561 A1* | 10/2022 | Cha | G06V 40/1318 |
| 2023/0144932 A1* | 5/2023 | Zhao | H10K 59/131 |
| | | | 382/124 |

FOREIGN PATENT DOCUMENTS

| | | | |
|---|---|---|---|
| KR | 10-0729047 B1 | 6/2007 | |
| KR | 10-0840099 B1 | 6/2008 | |
| KR | 10-0957585 B1 | 5/2010 | |
| KR | 10-2018-0085097 A | 7/2018 | |
| KR | 10-2021-0086907 A | 7/2021 | |
| KR | 10-2542606 B1 | 6/2023 | |

* cited by examiner

*Primary Examiner* — Joseph R Haley
(74) *Attorney, Agent, or Firm* — Innovation Counsel LLP

(57) ABSTRACT

A fingerprint sensor comprises a read-out line disposed on a substrate and extending in a first direction, a first sensor transistor controlling a sensing current based on a voltage of a sensor node, a second sensor transistor supplying a reset voltage to the sensor node based on a reset signal, a third sensor transistor electrically connected a first electrode of the first sensor transistor and the read-out line based on a gate signal, and a fourth sensor transistor comprising a gate electrode connected to a bias voltage line, a first electrode connected to the bias voltage line, and a second electrode connected to the sensor node.

17 Claims, 16 Drawing Sheets

ACTL1 : SE2, ACT2, DE2, SE1, ACT1, DE1
GTL1 : GE2, GE1, CPE1
GTL2 : CPE2
ACTL2 : DE3, ACT3, SE3
GTL3 : GE3
SDL1 : CE1, CE2, CE3
SDL2 : DL

ACTL1 : PED4, PACT4, PSE4
GTL1 : PGE4
ACTL2 : PDE2, PACT2, PSE2
GTL3 : PGE2
SDL1 : PCE1, PCE2, PCE3
SDL2 : VRL, VBL

PCE2          PCE3

PED4  PGE4  PACT4  PSE4

PT4

PCE2     RFL     PCE3

ILD2
GI3
ILD1
GI2
GI1
BF
SUB

PED4  PACT4  PGE4  PSE4

PT4

PED4  PGE4  PACT4  PSE4

PT4

PED4  PACT4  PGE4  PSE4

PT4

FINGERPRINT SENSOR AND DISPLAY DEVICE INCLUDING THE SAME

CROSS-REFERENCE TO RELATED APPLICATION

This application claims priority from Korean Patent Application No. 10-2023-0155574 filed on Nov. 10, 2023 in the Korean Intellectual Property Office, and all the benefits accruing therefrom under 35 U.S.C. 119, the content of which in its entirety are herein incorporated by reference.

BACKGROUND

1. Technical Field

The present disclosure relates to a fingerprint sensor and a display device including the same.

2. Description of the Related Art

With the advance of information-oriented society, more and more demands are placed on display devices for displaying images. For example, display devices are employed in various electronic devices such as smartphones, digital cameras, laptop computers, navigation devices, and smart televisions. In the display device, since each of pixels of a display panel includes a light emitting element capable of emitting light on its own, an image can be displayed without a backlight unit providing light to the display panel.

The display device may include a display panel that displays an image, an optical sensor that detects light, a fingerprint sensor that detects a person's fingerprint, and the like. With diversification of electronic devices employing display devices, it is required for the display devices to be provided in various designs. For example, the display device may expand a display area for displaying images by removing a sensor device such as a separate optical sensor or fingerprint sensor.

SUMMARY

Aspects of the present disclosure provide a fingerprint sensor and a display device including the same that can minimize leakage current flowing in a fingerprint sensor and improve sensitivity of the fingerprint sensor even in a high-resolution structure with dense pixels and a fingerprint sensor.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to an embodiment, a fingerprint sensor comprises a read-out line disposed on a substrate and extending in a first direction, a first sensor transistor controlling a sensing current based on a voltage of a sensor node, a second sensor transistor supplying a reset voltage to the sensor node based on a reset signal, a third sensor transistor electrically connected a first electrode of the first sensor transistor and the read-out line based on a gate signal, and a fourth sensor transistor comprising a gate electrode connected to a bias voltage line, a first electrode connected to the bias voltage line, and a second electrode connected to the sensor node.

The second sensor transistor may supply the reset voltage to the sensor node during a first period. The fourth sensor transistor may supply a leakage current to the sensor node during a second period after the first period. The third sensor transistor may be turned on during a third period after the second period.

The fingerprint sensor may further comprise a first active layer disposed on the substrate and comprising a semiconductor region of each of the first sensor transistor, the third sensor transistor, and the fourth sensor transistor, a first gate layer disposed on the first active layer, a second gate layer disposed on the first gate layer, a second active layer disposed on the second gate layer and comprising a semiconductor region of the second sensor transistor, a third gate layer disposed on the second active layer, a first source metal layer disposed on the third gate layer, and a second source metal layer disposed on the first source metal layer.

The fingerprint sensor may further comprise a shielding electrode disposed on the second source metal layer to overlap the second sensor transistor without overlapping the fourth sensor transistor.

The fingerprint sensor may further comprise a hole transporting layer disposed on the shielding electrode to overlap the first to fourth sensor transistors, an electron transporting layer disposed on the hole transporting layer to overlap the first to fourth sensor transistors, and a common electrode disposed on the electron transporting layer to overlap the first to fourth sensor transistors.

A gate electrode of the fourth sensor transistor may comprise a hole exposing a portion of a semiconductor region from a reflected light.

According to an embodiment, a fingerprint sensor comprises a read-out line disposed on a substrate and extending in a first direction, a first sensor transistor controlling a sensing current based on a voltage of a sensor node, a second sensor transistor supplying a reset voltage to the sensor node based on a reset signal, a third sensor transistor electrically connecting a first electrode of the first sensor transistor and the read-out line based on a gate signal, and a fourth sensor transistor comprising a gate electrode connected to a leakage voltage line to receive a leakage voltage, a first electrode connected to a bias voltage line to receive a bias voltage smaller than the leakage voltage, and a second electrode connected to the sensor node.

The second sensor transistor may supply the reset voltage to the sensor node during a first period. The fourth sensor transistor may supply a leakage current to the sensor node during a second period after the first period. The third sensor transistor may be turned on during a third period after the second period.

The fingerprint sensor may further comprise a first active layer disposed on the substrate and comprising a semiconductor region of each of the first sensor transistor, the third sensor transistor, and the fourth sensor transistor, a first gate layer disposed on the first active layer, a second gate layer disposed on the first gate layer, a second active layer disposed on the second gate layer and comprising a semiconductor region of the second sensor transistor, a third gate layer disposed on the second active layer, a first source metal layer disposed on the third gate layer, and a second source metal layer disposed on the first source metal layer.

The fingerprint sensor may further comprise a shielding electrode disposed on the second source metal layer to overlap the second sensor transistor without overlapping the fourth sensor transistor.

The fingerprint sensor may further comprise a hole transporting layer disposed on the shielding electrode to overlap the first to fourth sensor transistors, an electron transporting layer disposed on the hole transporting layer to overlap the first to fourth sensor transistors, and a common electrode disposed on the electron transporting layer to overlap the first to fourth sensor transistors.

A gate electrode of the fourth sensor transistor may comprise a hole exposing a portion of a semiconductor region to a reflected light.

According to an embodiment, a display device comprises a pixel disposed in an emission area and comprising a light emitting element, and a fingerprint sensor disposed in a sensor area. The fingerprint sensor comprises a read-out line disposed on a substrate and extending in a first direction, a first sensor transistor controlling a sensing current based on a voltage of a sensor node, a second sensor transistor supplying a reset voltage to the sensor node based on a reset signal, a third sensor transistor electrically connecting a first electrode of the first sensor transistor and the read-out line based on a first gate signal, and a fourth sensor transistor comprising a gate electrode connected to a leakage voltage line to receive a leakage voltage, a first electrode connected to a bias voltage line to receive a bias voltage smaller than the leakage voltage, and a second electrode connected to the sensor node.

The pixel may comprise a first transistor controlling a driving current flowing through the light emitting element, a second transistor supplying a data voltage to a first electrode of the first transistor based on the first gate signal, a third transistor electrically connecting a second electrode and a gate electrode of the first transistor based on a second gate signal, and a fourth transistor discharging the gate electrode of the first transistor to a first initialization voltage based on a third gate signal.

The semiconductor region of each of the first transistor and the second transistor may contain a silicon-based material, and the semiconductor region of each of the third transistor and the fourth transistor may contain an oxide-based material.

The pixel further may comprise a fifth transistor supplying a driving voltage to the first electrode of the first transistor based on an emission signal, a sixth transistor electrically connecting the second electrode of the first transistor and the light emitting element based on the emission signal, and a seventh transistor discharging a first electrode of the light emitting element to a second initialization voltage based on a fourth gate signal.

The display device may further comprise a first active layer disposed on the substrate and comprising a semiconductor region of each of the first sensor transistor, the third sensor transistor, and the fourth sensor transistor, a first gate layer disposed on the first active layer, a second gate layer disposed on the first gate layer, a second active layer disposed on the second gate layer and comprising a semiconductor region of the second sensor transistor, a third gate layer disposed on the second active layer, a first source metal layer disposed on the third gate layer, and a second source metal layer disposed on the first source metal layer.

The light emitting element may comprise a pixel electrode disposed on the second source metal layer, a hole transporting layer disposed on the pixel electrode and implemented as a common layer of the emission area and the sensor area, a light emitting layer disposed on the hole transporting layer, an electron transporting layer disposed on the light emitting layer and implemented as a common layer of the emission area and the sensor area, and a common electrode disposed on the electron transporting layer.

The fingerprint sensor may comprise a shielding electrode disposed on the same layer as the pixel electrode to overlap the second sensor transistor without overlapping the fourth sensor transistor.

A gate electrode of the fourth transistor may comprise a hole exposing a portion of a semiconductor region to a reflected light.

The fingerprint sensor and the display device including the same according to embodiments may include a phototransistor with a gate-source voltage greater than zero, thereby minimizing the leakage current flowing in a fingerprint sensor and improving the sensitivity of the fingerprint sensor even in a high-resolution structure with dense pixels and a fingerprint sensor.

However, effects according to the embodiments of the present disclosure are not limited to those exemplified above and various other effects are incorporated herein.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Figure 1:
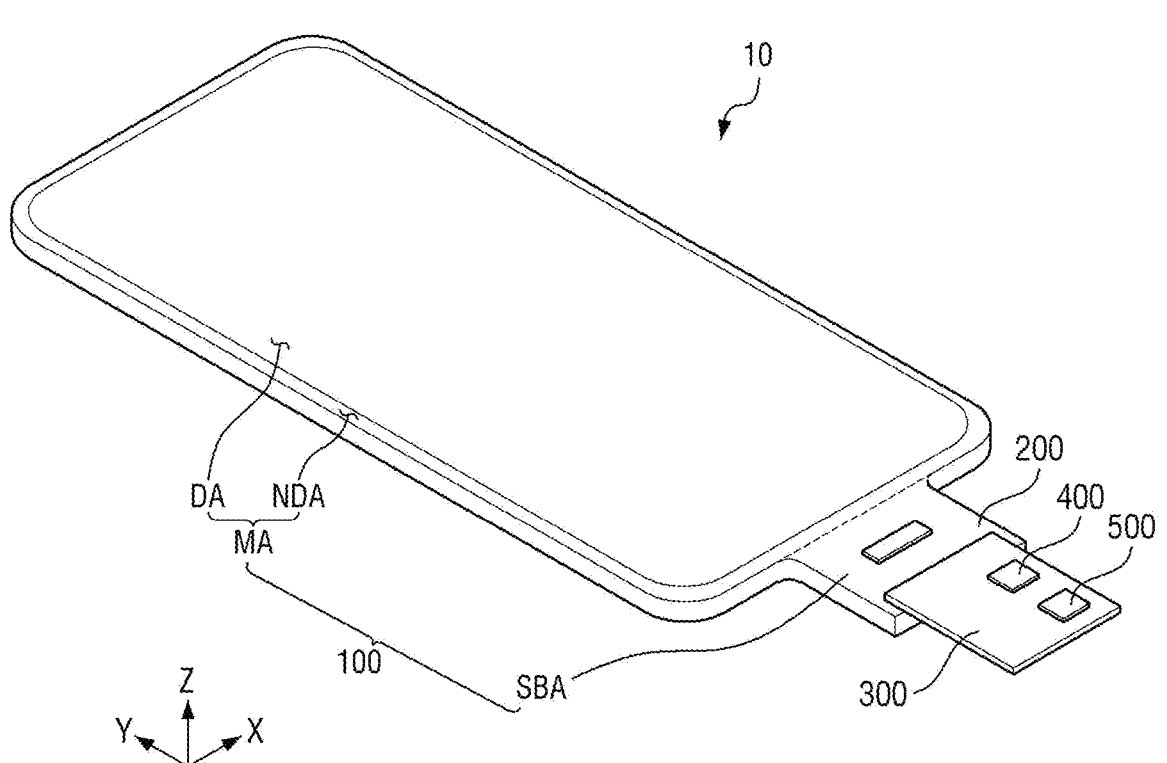
FIG. 1 is a perspective view showing a display device according to one embodiment.

In the following description, for the purposes of explanation, numerous details are set forth to provide a thorough understanding of various embodiments or implementations of the disclosure. As used herein "embodiments" and "implementations" are interchangeable words that are non-limiting examples of devices or methods employing one or more of the concepts disclosed herein. It is apparent, however, that various embodiments may be practiced without these specific details or with one or more equivalent arrangements. In other instances, structures and devices are shown in block diagram form to avoid unnecessarily obscuring various embodiments. Further, various embodiments may be different, but do not have to be exclusive or limit the disclosure. For example, specific shapes, configurations, and characteristics of an embodiment may be used or implemented in other embodiments without departing from the disclosure.

Unless otherwise specified, the illustrated embodiments are to be understood as providing features of varying detail of some ways in which the disclosure may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

Further, the X-axis, the Y-axis, and the Z-axis are not limited to three axes of a rectangular coordinate system, and thus the X-, Y-, and Z-axes, and may be interpreted in a broader sense. For example, the X-axis, the Y-axis, and the Z-axis may be perpendicular to one another, or may represent different directions that are not perpendicular to one another.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, ZZ, or the like. As used herein, the term "and/or" includes any and all combinations of one or more of the associated listed items.

Although the terms "first," "second," and the like may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature, and the shapes of these regions may not reflect actual shapes of regions of a device and, as such, are not necessarily intended to be limiting.

As customary in the field, some embodiments are described and illustrated in the accompanying drawings in terms of functional blocks, units, parts, and/or modules. Those skilled in the art will appreciate that these blocks, units, parts, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, parts, and/or modules being implemented by microprocessors or other similar hardware, they may be programmed and controlled using software (e.g., microcode) to perform various functions discussed herein and may optionally be driven by firmware and/or software. It is also contemplated that each block, unit, part, and/or module may be implemented by dedicated hardware, or as a combination of dedicated hardware to perform some functions and a processor (e.g., one or more programmed microprocessors and associated circuitry) to perform other functions. Also, each block, unit, part, and/or module of some embodiments may be physically separated into two or more interacting and discrete blocks, units, parts, and/or modules without departing from the scope of the disclosure. Further, the blocks, units, parts, and/or modules of some embodiments may be physically combined into more complex blocks, units, parts, and/or modules without departing from the scope of the disclosure.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, detailed embodiments of the disclosure is described with reference to the accompanying drawings.

FIG. 1 is a perspective view showing a display device according to one embodiment.

Referring to FIG. 1, a display device 10 may be applied to portable electronic devices such as a mobile phone, a smartphone, a tablet personal computer, a mobile communication terminal, an electronic organizer, an electronic book, a portable multimedia player (PMP), a navigation system, an ultra mobile PC (UMPC) or the like. For example, the display device 10 may be applied as a display unit of a television, a laptop, a monitor, a billboard, or an Internet-of-Things (IoT) device. For another example, the display device 10 may be applied to wearable devices such as a smart watch, a watch phone, a glasses type display, or a head mounted display (HMD).

The display device 10 may have a planar shape similar to a quadrilateral shape. In the embodiment of FIG. 1, the display device 10 may have a shape similar to a quadrilateral shape, in plan view, having short sides in an X-axis direction and long sides in a Y-axis direction. The corner where the short side in the X-axis direction and the long side in the Y-axis direction meet may be rounded to have a predetermined curvature or may be right-angled. The planar shape of the display device 10 is not limited to a quadrilateral shape, and may be formed in a shape similar to another polygonal shape, a circular shape, or elliptical shape.

The display device 10 may include a display panel 100, a display driver 200, a circuit board 300, a touch driver 400, and a power supply unit 500.

The display panel 100 may include a main region MA and a sub-region SBA.

The main region MA may include a display area DA including pixels displaying an image and a non-display area NDA disposed around the display area DA. The display area DA may emit light from a plurality of emission areas or a plurality of opening areas. For example, the display panel 100 may include a pixel circuit including switching elements, a pixel defining layer defining an emission area or an opening area, and a self-light emitting element.

For example, the self-light emitting element may include one of an organic light emitting diode (LED) including an organic light emitting layer, a quantum dot LED including a quantum dot light emitting layer, an inorganic LED including an inorganic semiconductor, and a micro LED, but is not limited thereto.

The non-display area NDA may be an area outside the display area DA. The non-display area NDA may be defined as an edge area of the main region MA of the display panel 100. The non-display area NDA may include a gate driver (not illustrated) that supplies gate signals to the gate lines, and fan-out lines (not illustrated) that connect the display driver 200 to the display area DA.

The sub-region SBA may extend from one side of the main region MA. The sub-region SBA may include a flexible material which can be bent, folded or rolled. For example, when the sub-region SBA is bent, the sub-region SBA may overlap the main region MA in a thickness direction (Z-axis direction). The sub-region SBA may include the display driver 200 and a pad portion connected to the circuit board 300. Optionally, the sub-region SBA may be omitted, and the display driver 200 and the pad portion may be arranged in the non-display area NDA.

The display driver 200 may output signals and voltages for driving the display panel 100. The display driver 200 may supply data voltages to data lines. The display driver 200 may supply a power voltage to the power line and may supply a gate control signal to the gate driver. The display driver 200 may receive a sensing signal through a read-out line. The display driver 200 may be formed as an integrated circuit (IC) and mounted on the display panel 100 by a chip on glass (COG) method, a chip on plastic (COP) method, or an ultrasonic bonding method. For example, the display driver 200 may be disposed in the sub-region SBA, and may overlap the main region MA in the thickness direction (Z-axis direction) by bending of the sub-region SBA. For another example, the display driver 200 may be mounted on the circuit board 300.

The circuit board 300 may be attached to the pad portion of the display panel 100 by using an anisotropic conductive film (ACF). Lead lines of the circuit board 300 may be electrically connected to the pad portion of the display panel 100. The circuit board 300 may be a flexible printed circuit board, a printed circuit board, or a flexible film such as a chip on film.

The touch driver 400 may be mounted on the circuit board 300. The touch driver 400 may be electrically connected to a touch sensing unit of the display panel 100. The touch driver 400 may supply a touch driving signal to a plurality of touch electrodes of the touch sensing unit and may sense an amount of change in capacitance between the plurality of touch electrodes. For example, the touch driving signal may be a pulse signal having a predetermined frequency. The touch driver 400 may calculate whether an input is made and input coordinates based on an amount of change in capacitance between the plurality of touch electrodes. The touch driver 400 may be formed as an integrated circuit (IC).

The power supply unit 500 may be disposed on the circuit board 300 to supply a power voltage to the display driver 200 and the display panel 100. The power supply unit 500 may generate a driving voltage to supply it to a driving voltage line, and may generate a common voltage to supply it to a common electrode that is common to the light emitting elements of a plurality of pixels. For example, the driving voltage may be a high potential voltage for driving the light emitting element, and the common voltage may be a low potential voltage for driving the light emitting element. The power supply unit 500 may generate an initialization voltage to supply it to an initialization voltage line, generate a reference voltage to supply it to a reference voltage line, generate a bias voltage to supply it to a bias voltage line, and generate a reset voltage to supply it to a reset voltage line.

Figure 2:
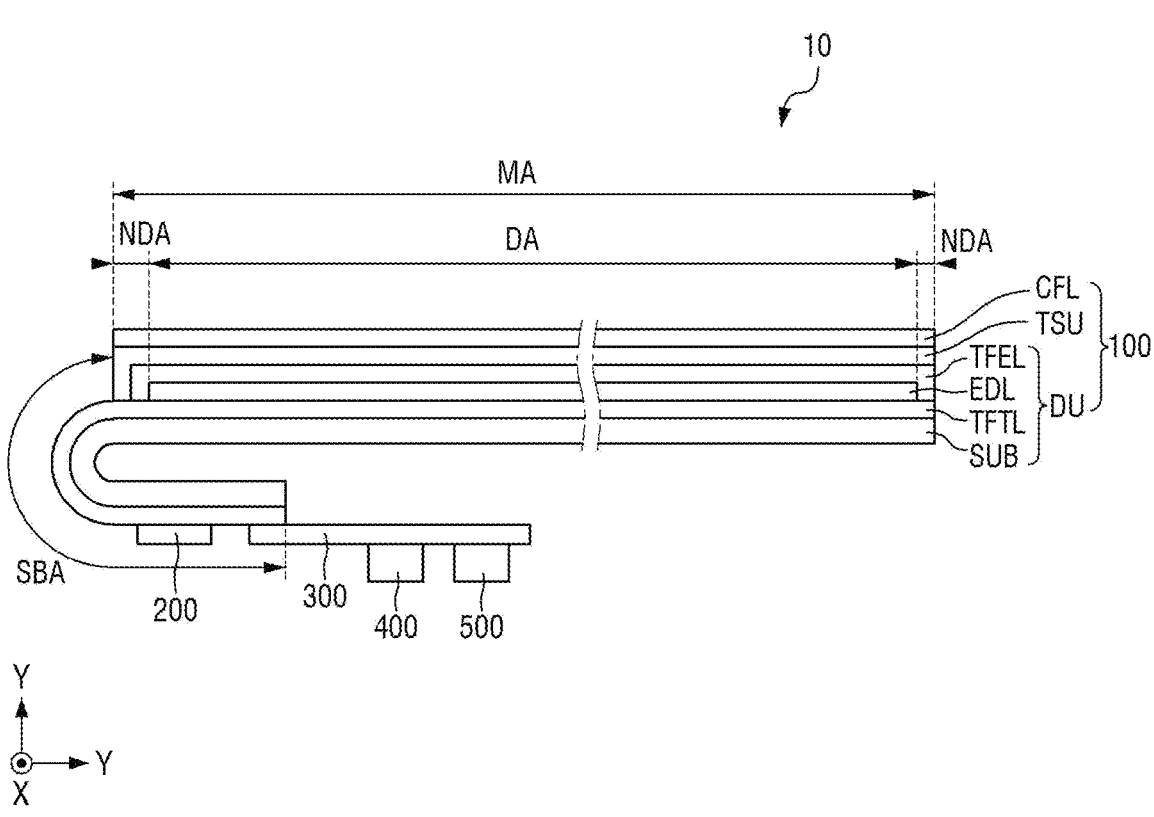
FIG. 2 is a cross-sectional view illustrating a display device according to one embodiment.

FIG. 2 is a cross-sectional view illustrating a display device according to one embodiment.

Referring to FIG. 2, the display panel 100 may include a display unit DU, a touch sensing unit TSU, and a color filter layer CFL. The display unit DU may include a substrate SUB, a transistor layer TFTL, a light emitting element layer EDL, and an encapsulation layer TFEL.

The substrate SUB may be a base substrate or a base member. The substrate SUB may be a flexible substrate which can be bent, folded or rolled. For example, the substrate SUB may include a polymer resin such as polyimide (PI), but is not limited thereto. For another example, the substrate SUB may include a glass material or a metal material.

The transistor layer TFTL may be disposed on the substrate SUB. The transistor layer TFTL may include a plurality of transistors constituting a pixel and a fingerprint sensor. The transistor layer TFTL may further include gate lines, data lines, power lines, read-out lines, gate control lines, fan-out lines connecting the display driver 200 and the data lines, and lead lines connecting the display driver 200 to the pad portion. Each of the transistors may include a semiconductor region, a source electrode, a drain electrode, and a gate electrode. For example, when the gate driver is formed on one side of the non-display area NDA of the display panel 100, the gate driver may include transistors.

The transistor layer TFTL may be disposed in the display area DA, the non-display area NDA, and the sub-region SBA. The transistors, gate lines, data lines, power lines, and read-out lines of the transistor layer TFTL may be disposed in the display area DA. The gate control lines and the fan-out lines of the transistor layer TFTL may be disposed in the non-display area NDA. The lead lines of the transistor layer TFTL may be disposed in the sub-region SBA.

The light emitting element layer EDL may be disposed on the transistor layer TFTL. The light emitting element layer EDL may include a light emitting element of the pixel, and a pixel defining layer that defines the pixel and the fingerprint sensor. The light emitting element may emit light by being formed of a pixel electrode, a light emitting layer, and a common electrode sequentially stacked.

For example, the light emitting layer may be an organic light emitting layer including an organic material. The light emitting layer may include a hole transporting layer, an organic light emitting layer, and an electron transporting layer. When the pixel electrode receives a predetermined voltage through the transistor of the transistor layer TFTL and the common electrode receives a cathode voltage, holes may move to the organic light emitting layer through the hole transporting layer, electrons may move to the organic light emitting layer through the electron transporting layer, and the holes and the electrons may combine with each other in the organic light emitting layer to emit light. For example, the pixel electrode may be an anode electrode, and the common electrode may be a cathode electrode, but the present disclosure is not limited thereto.

For example, the plurality of light emitting elements may include a quantum dot light emitting diode including a quantum dot light emitting layer, an inorganic light emitting diode including an inorganic semiconductor, or a micro light emitting diode.

The encapsulation layer TFEL may cover the top surface and the side surface of the light emitting element layer EDL, and may protect the light emitting element layer EDL. The encapsulation layer TFEL may include at least one inorganic layer and at least one organic layer for encapsulating the light emitting element layer EDL.

The touch sensing unit TSU may be disposed on the encapsulation layer TFEL. The touch sensing unit TSU may include a plurality of touch electrodes for sensing a user's touch in a capacitive manner, and touch lines connecting the plurality of touch electrodes to the touch driver 400. The plurality of touch electrodes of the touch sensing unit TSU may be disposed in a touch sensor area overlapping the display area DA. The touch lines of the touch sensing unit TSU may be disposed in a touch peripheral area that overlaps the non-display area NDA. For example, the touch sensing unit TSU may sense the user's touch by using a mutual capacitance method or a self-capacitance method.

For another example, the touch sensing unit TSU may be disposed on a separate substrate disposed on the display unit DU. In this case, the substrate supporting the touch sensing unit TSU may be a base member that encapsulates the display unit DU.

The color filter layer CFL may be disposed on the touch sensing unit TSU. The color filter layer CFL may include a plurality of color filters respectively corresponding to the plurality of emission areas. Each of the color filters may selectively transmit light of a specific wavelength and may block or absorb light of a different wavelength. The color filter layer CFL may absorb a part of light coming from the outside of the display device 10 to reduce reflection of external light. Accordingly, the color filter layer CFL may prevent color distortion caused by reflection of external light.

Since the color filter layer CFL is directly disposed on the touch sensing unit TSU, the display device 10 may not require a separate substrate for the color filter layer CFL. Therefore, the thickness of the display device 10 may be reduced.

The sub-region SBA of the display panel 100 may extend from one side of the main region MA. The sub-region SBA may include a flexible material which can be bent, folded or rolled. For example, when the sub-region SBA is bent, the sub-region SBA may overlap the main region MA in a thickness direction (Z-axis direction). The sub-region SBA may include the display driver 200 and the pad portion electrically connected to the circuit board 300.

Figure 3:
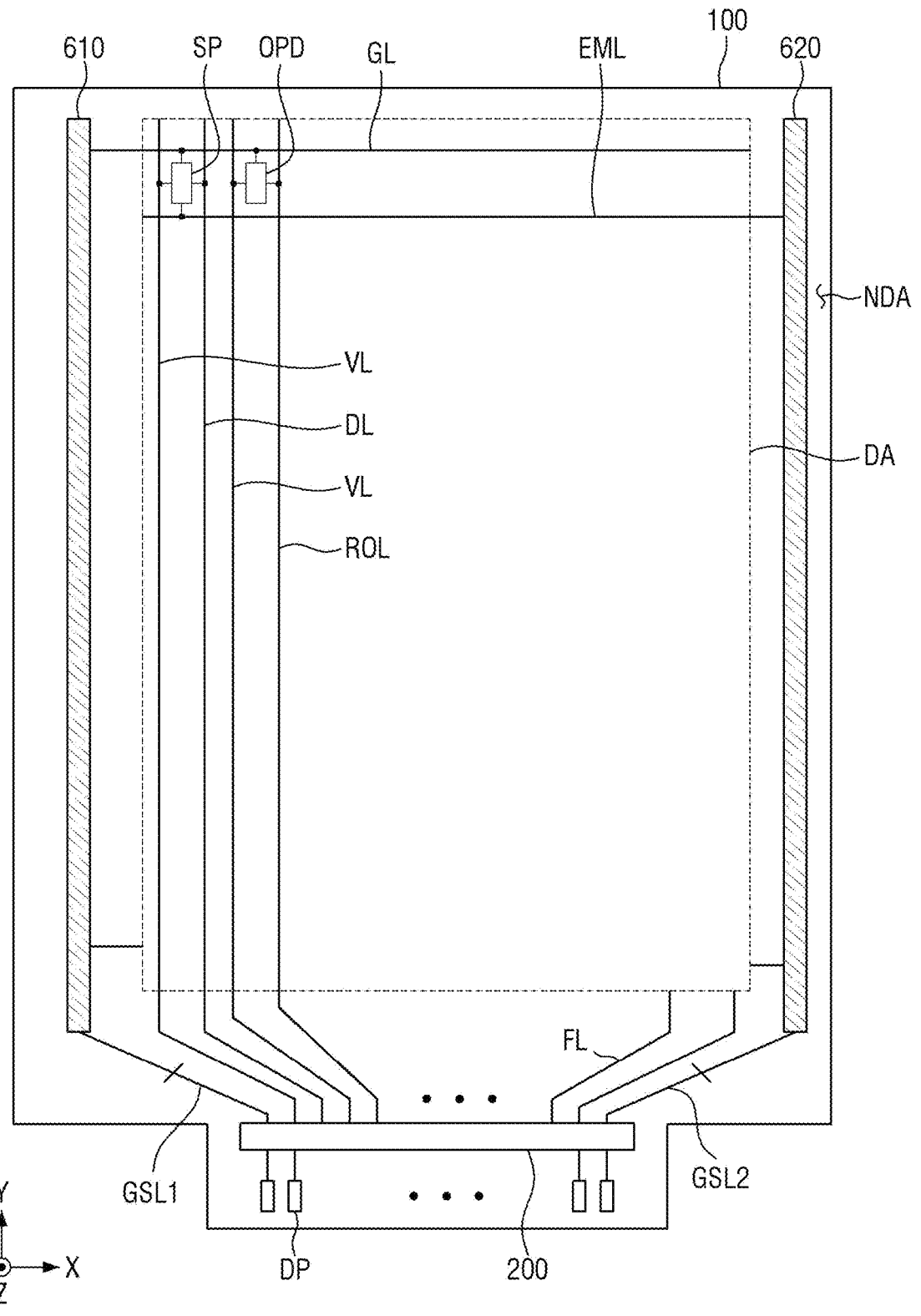
FIG. 3 is a plan view illustrating a display unit of a display device according to one embodiment.
Figure 4:
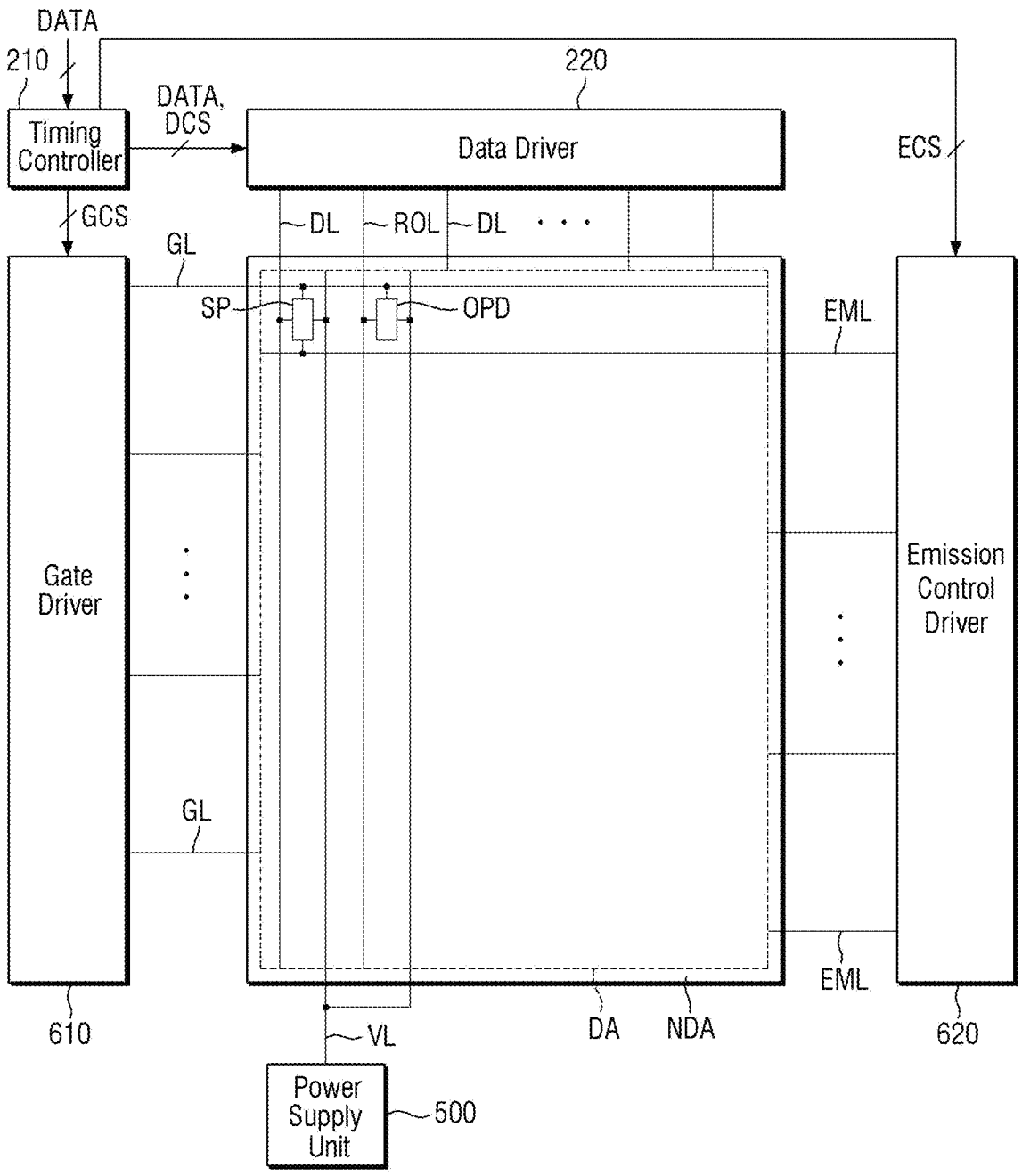
FIG. 4 is a block diagram illustrating a display panel and a display driver according to one embodiment.

FIG. 3 is a plan view illustrating a display unit of a display device according to one embodiment. FIG. 4 is a block diagram illustrating a display panel and a display driver according to one embodiment.

Referring to FIGS. 3 and 4, the display panel 100 may include the display area DA and the non-display area NDA. The display area DA may include pixels SP, fingerprint sensors OPD, power lines VL, data lines DL, read-out lines ROL, gate lines GL, and emission control lines EML.

Each of the plurality of pixels SP may be connected to the gate line GL, the emission control line EML, the data line DL, and the power line VL. Each of the pixels SP may include a plurality of transistors, a light emitting element and a capacitor.

Each of the plurality of fingerprint sensors OPD may be connected to the gate line GL, the power line VL, and the read-out line ROL. Each of the plurality of fingerprint sensors OPD may include a plurality of transistors.

The gate lines GL may extend in the X-axis direction and may be spaced apart from each other in the Y-axis direction that crosses the X-axis direction. The gate lines GL may sequentially supply gate signals to the pixels SP and the fingerprint sensors OPD.

The emission control lines EML may extend in the X-axis direction and may be spaced apart from each other in the Y-axis direction. The emission control lines EML may sequentially supply emission signals to the pixels SP.

The data lines DL may extend in the Y-axis direction and may be spaced apart from each other in the X-axis direction. The data lines DL may supply the data voltage to the pixels SP. The data voltage may determine the luminance of each of the pixels SP.

The power lines VL may extend in the Y-axis direction and may be spaced apart from each other in the X-axis direction. The power line VL may supply a power voltage to the pixels SP and the fingerprint sensors OPD. Here, the power voltage may be a driving voltage, a common voltage, an initialization voltage, a reference voltage, a bias voltage, or a reset voltage. The driving voltage may be a high potential voltage for driving the pixel SP, and the common voltage may be a low potential voltage for driving the pixel SP and the fingerprint sensors OPD.

The non-display area NDA may surround the display area DA. The non-display area NDA may include a gate driver 610, an emission control driver 620, fan-out lines FL, a first gate control line GSL1, and a second gate control line GSL2.

As shown in FIG. 3, the fan-out lines FL may extend from the display driver 200 to the display area DA. The fan-out lines FL may supply a data voltage received from the display driver 200 to the data line DL, may supply a power voltage received from the display driver 200 to the power line VL, and supply a sensing signal received from the read-out line ROL to the display driver 200. Accordingly, the display driver 200 may drive the pixel SP and the fingerprint sensor OPD.

The first gate control line GSL1 may extend from the display driver 200 to the gate driver 610. The first gate control line GSL1 may supply a gate control signal GCS received from the display driver 200 to the gate driver 610.

The second gate control line GSL2 may extend from the display driver 200 to the emission control driver 620. The second gate control line GSL2 may supply an emission control signal ECS received from the display driver 200 to the emission control driver 620.

The sub-region SBA may extend from one side of the non-display area NDA. The sub-region SBA may include the display driver 200 and a pad portion DP. The pad portion DP may be disposed closer to one edge of the sub-region SBA than the display driver 200. The pad portion DP may be electrically connected to the circuit board 300 through an anisotropic conductive film.

FIG. 4 depicts that the display driver 200 may include a timing controller 210 and a data driver 220.

The timing controller 210 may receive digital video data DATA and timing signals from the circuit board 300. The timing controller 210 may generate, based on the timing signals, a data control signal DCS, and supply the digital video data DATA and the data control signal DCS to the data driver 220 to control the operation timing of the data driver 220. The timing controller 210 may supply the gate control signal GCS to the gate driver 610 and control the operation timing of the gate driver 610. The timing controller 210 may supply the emission control signal ECS to the emission control driver 620 and control the operation timing of the emission control driver 620.

The data driver 220 may convert the digital video data DATA into analog data voltages and supply them to the data lines DL through the fan-out lines FL. The gate signals of the gate driver 610 may select pixels SP to which the data voltage is supplied, and the selected pixels SP may receive the data voltage through the data lines DL. The data driver 220 may supply a sensing signal received through the read-out line ROL to a main processor.

The power supply unit 500 may be disposed on the circuit board 300 to supply a power voltage to the display driver 200 and the display panel 100. The power supply unit 500 may generate a power voltage to supply it to the power line VL, and generate a common voltage to supply it to the common electrode that is common to the pixels SP and the fingerprint sensors OPD. The power supply unit 500 may generate an initialization voltage to supply it to an initialization voltage line, generate a reference voltage to supply it to a reference voltage line, generate a bias voltage to supply it to a bias voltage line, and generate a reset voltage to supply it to a reset voltage line.

The gate driver 610 may be disposed at one external side of the display area DA or at one side of the non-display area NDA. The emission control driver 620 may be disposed at the other external side of the display area DA or at the other side of the non-display area NDA. However, the present disclosure is not limited thereto. As another example, the gate driver 610 and the emission control driver 620 may be disposed at any one of one side and the other side of the non-display area NDA.

The gate driver 610 may include a plurality of transistors for generating gate signals based on the gate control signal GCS. The emission control driver 620 may include a plurality of transistors for generating emission signals based on the emission control signal ECS. For example, the transistors of the gate driver 610 and the transistors of the emission control driver 620 may be formed in the same layer as the transistors of each pixel SP. The gate driver 610 may supply the gate signals to the gate lines GL, and the emission control driver 620 may supply the emission signals to the emission control lines EML.

Figure 5:
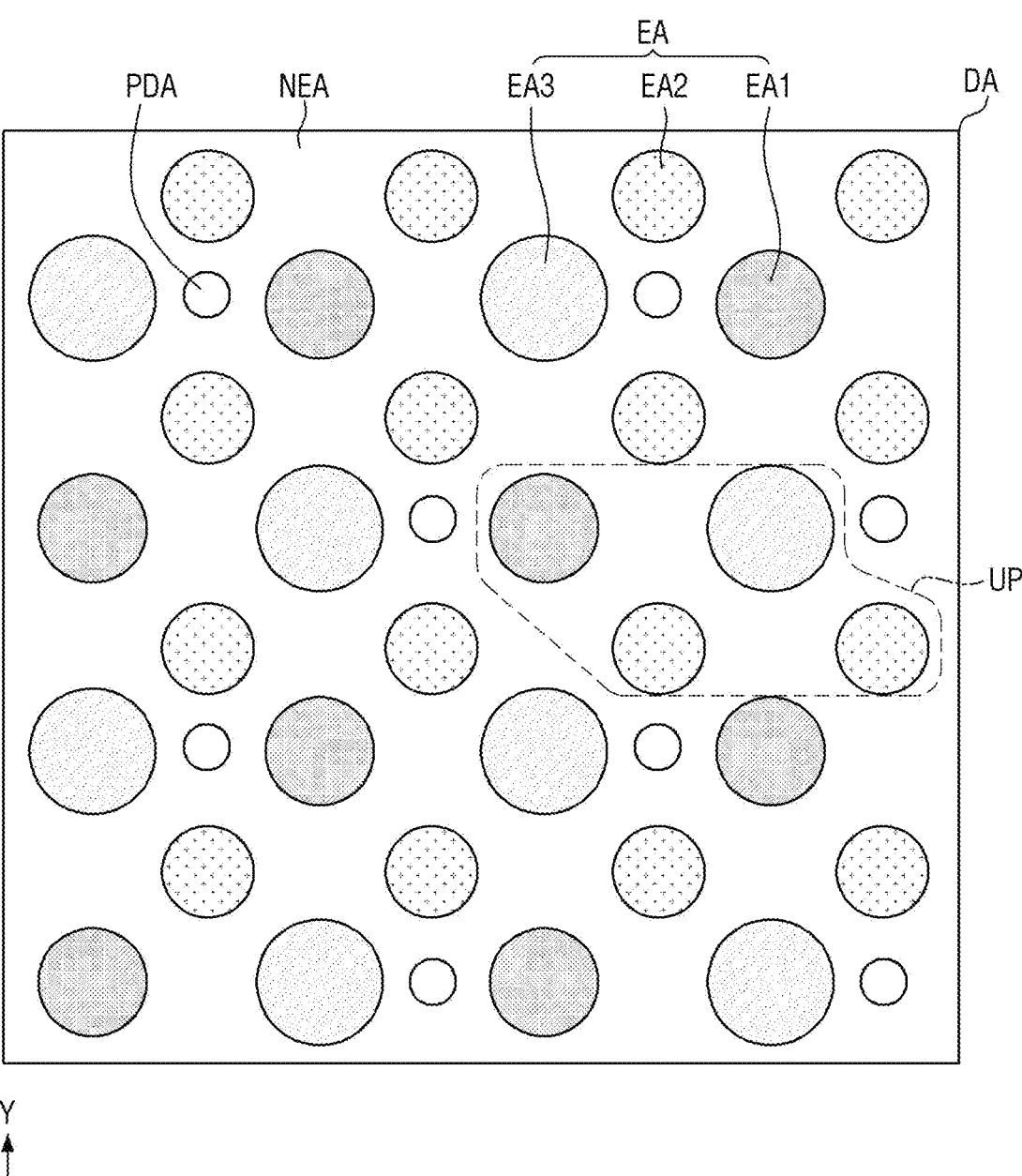
FIG. 5 is a plan view illustrating a display area of a display device according to one embodiment.

FIG. 5 is a plan view illustrating a display area DA of a display device according to one embodiment.

Referring to FIG. 5, the display area DA may include emission areas EA and a non-emission area NEA. The emission areas EA may emit light of the light emitting elements, and the light emitting elements may not be disposed in the non-emission area NEA. The non-emission area NEA may include sensor areas PDA spaced apart from each other with at least one emission area EA therebetween. The emission areas EA may include first to third emission areas EA1, EA2, and EA3. For example, the first emission area EA1 may emit light of a first color or red light, the second emission area EA2 may emit light of a second color or green light, and the third emission area EA3 may emit light of a third color or blue light, but is not limited thereto.

FIG. 5 depicts a unit pixel UP, which may represent white gray scale by including one first emission area EA1, two second emission areas EA2, and one third emission area EA3, but the configuration of the unit pixel UP is not limited thereto. The white gray scale may be represented by a combination of light emitted from one first emission area EA1, light emitted from two second emission areas EA2, and light emitted from one third emission area EA3.

The first to third emission areas EA1, EA2, and EA3 may be different in size from each other. For example, the size of the third emission area EA3 may be larger than that of the first emission area EA1, and the size of the first emission area EA1 may be larger than that of the second emission area EA2. However, the present disclosure is not limited thereto. As another example, the sizes of the first to third emission areas EA1, EA2, and EA3 may be the same.

The sensor area PDA may be surrounded by the first to third emission areas EA1, EA2, and EA3. The sensor area PDA may be adjacent to the first or third emission area EA1 or EA3 in the X-axis direction, and may be adjacent to the second emission area EA2 in the Y-axis direction. The sensor areas PDA may be spaced apart from each other with at least one emission area EA therebetween. The sensor area PDA may receive light reflected by the fingerprint.

Figure 6:
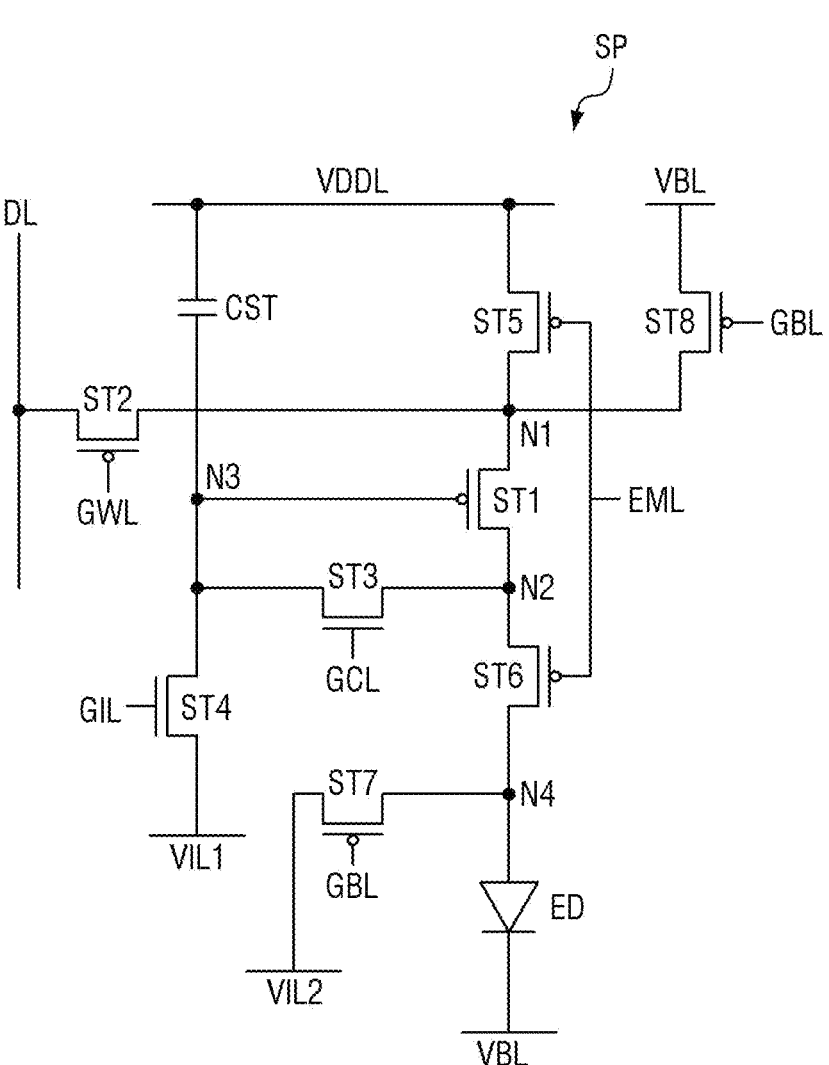
FIG. 6 is a circuit diagram illustrating a pixel of a display device according to one embodiment.

FIG. 6 is a circuit diagram illustrating a pixel SP of a display device according to one embodiment.

Referring to FIG. 6, the pixel SP may be connected to a first gate line GWL, a second gate line GCL, a third gate line GIL, a fourth gate line GBL, the emission control line EML, the data line DL, a driving voltage line VDDL, a first initialization voltage line VIL1, a second initialization voltage line VIL2, and a bias voltage line VBL.

The pixel SP may include a light emitting element ED and a pixel circuit for driving the light emitting element ED. The pixel circuit may include first to seventh transistors ST1, ST2, ST3, ST4, ST5, ST6, and ST7 and a capacitor CST.

The first transistor ST1 may control a driving current supplied to the light emitting element ED. The first transistor ST1 may include a gate electrode, a first electrode, and a second electrode. The gate electrode of the first transistor ST1 may be connected to a third node N3, the first electrode thereof may be connected to a first node N1, and the second electrode thereof may be connected to a second node N2. For example, the first electrode of the first transistor ST1 may be a source electrode and the second electrode thereof may be a drain electrode, but the present disclosure is not limited thereto.

The first transistor ST1 may control a source-drain current Isd (hereinafter, referred to as "driving current") according to the data voltage applied to the gate electrode. The driving current Isd flowing through the channel of the first transistor ST1 may be proportional to the square of a difference between a threshold voltage Vth and a voltage Vsg between the source electrode and the gate electrode of the first transistor ST1 ($Isd=k \times (Vsg-Vth)^2$). Here, k is a proportional coefficient determined by the structure and physical characteristics of the first transistor ST1, Vsg is a source-gate voltage of the first transistor ST1, and Vth is a threshold voltage of the first transistor ST1.

The light emitting element ED may emit light by receiving the driving current Isd. The emission amount or the luminance of the light emitting element ED may be proportional to the magnitude of the driving current Isd. The light emitting element ED may include a first electrode, a second electrode, and a light emitting layer disposed between the first electrode and the second electrode. The first electrode of the light emitting element ED may be connected to a fourth node N4. The first electrode of the light emitting element ED may be connected to the second electrode of the sixth transistor ST6 and the first electrode of the seventh transistor ST7 through the fourth node N4. The second electrode of the light emitting element ED may be electrically connected to the bias voltage line VBL. The second electrode of the light emitting element ED may receive a bias voltage or a low potential voltage from the bias voltage line VBL. For example, the first electrode of the light emitting element ED may be an anode electrode or a pixel electrode, and the second electrode thereof may be a cathode electrode or a common electrode, but the present disclosure is not limited thereto.

The second transistor ST2 may be turned on by the first gate signal of the first gate line GWL to electrically connect the data line DL to the first node N1 which is the first electrode of the first transistor ST1. The second transistor ST2 may be turned on based on the first gate signal to supply the data voltage to the first node N1. The gate electrode of the second transistor ST2 may be connected to the first gate line GWL, the first electrode thereof may be connected to the data line DL, and the second electrode thereof may be connected to the first node N1. The second electrode of the second transistor ST2 may be connected to the first electrode of the first transistor ST1 and the second electrode of the fifth transistor ST5 through the first node N1. For example, the first electrode of the second transistor ST2 may be a source electrode and the second electrode thereof may be a drain electrode, but the present disclosure is not limited thereto.

The third transistor ST3 may be turned on by the second gate signal of the second gate line GCL to electrically connect the second node N2, which is the second electrode of the first transistor ST1, to the third node N3, which is the gate electrode the first transistor ST1. The gate electrode of the third transistor ST3 may be connected to the second gate line GCL, the first electrode thereof may be connected to the second node N2, and the second electrode thereof may be connected to the third node N3. The first electrode of the third transistor ST3 may be connected to the second electrode of the first transistor ST1 and the first electrode of the sixth transistor ST6. The second electrode of the third transistor ST3 may be connected to the gate electrode of the first transistor ST1, the first electrode of the fourth transistor ST4, and a first capacitor electrode of the capacitor CST through the third node N3. For example, the first electrode of the third transistor ST3 may be a drain electrode and the second electrode thereof may be a source electrode, but the present disclosure is not limited thereto.

The fourth transistor ST4 may be turned on by a third gate signal of the third gate line GIL to electrically connect the third node N3, which is the gate electrode of the first transistor ST1, to the first initialization voltage line VIL1. The fourth transistor ST4 may be turned on based on the third gate signal, thereby discharging the gate electrode of the first transistor ST1 to a first initialization voltage. The gate electrode of the fourth transistor ST4 may be connected to the third gate line GIL, the first electrode thereof may be connected to the third node N3, and the second electrode thereof may be connected to the first initialization voltage line VIL1. The first electrode of the fourth transistor ST4 may be connected to the gate electrode of the first transistor ST1, the second electrode of the third transistor ST3, and the first capacitor electrode of the capacitor CST. For example, the first electrode of each of the fourth transistor ST4 may be a drain electrode and the second electrode thereof may be a source electrode, but the present disclosure is not limited thereto.

The fifth transistor ST5 may be turned on by an emission signal of the emission control line EML to electrically connect the driving voltage line VDDL with the first node N1 that is the first electrode of the first transistor ST1. The gate electrode of the fifth transistor ST5 may be connected to the emission control line EML, the first electrode thereof may be connected to the driving voltage line VDDL, and the second electrode thereof may be connected to the first node N1. The second electrode of the fifth transistor ST5 may be electrically connected to the first electrode of the first transistor ST1 and the second electrode of the second transistor ST2 through the first node N1. For example, the first electrode of the fifth transistor ST5 may be a source electrode and the second electrode thereof may be a drain electrode, but the present disclosure is not limited thereto.

The sixth transistor ST6 may be turned on by the emission signal of the emission control line EML to electrically connect the second node N2 that is the second electrode of the first transistor ST1 with the fourth node N4 that is the first electrode of the light emitting element ED. The gate electrode of the sixth transistor ST6 may be connected to the emission control line EML, the first electrode thereof may be connected to the second node N2, and the second electrode thereof may be connected to the fourth node N4. The first electrode of the sixth transistor ST6 may be connected to the second electrode of the first transistor ST1 and the first electrode of the third transistor ST3 through the second node N2. The second electrode of the sixth transistor ST6 may be connected to the first electrode of the light emitting element ED and the first electrode of the seventh transistor ST7 through the fourth node N4. For example, the first electrode of the sixth transistor ST6 may be a source electrode and the second electrode thereof may be a drain electrode, but the present disclosure is not limited thereto.

When all of the fifth transistor ST5, the first transistor ST1, and the sixth transistor ST6 are turned on, the driving current Isd may be supplied to the plurality of light emitting elements ED.

The seventh transistor ST7 may be turned on by a fourth gate signal of the fourth gate line GBL to electrically connect the second initialization voltage line VIL2 to the fourth node N4, which is the first electrode of the light emitting element ED. By turning on the seventh transistor ST7 based on the fourth gate signal, the first electrode of the light emitting element ED may be discharged to a second initialization voltage. The gate electrode of the seventh transistor ST7 may be connected to the fourth gate line GBL, the first electrode thereof may be connected to the fourth node N4, and the second electrode thereof may be connected to the second initialization voltage line VIL2. The first electrode of the seventh transistor ST7 may be connected to the first electrode of the light emitting element ED and the second electrode of the sixth transistor ST6 through the fourth node N4. For example, the first electrode of the seventh transistor ST7 may be a source electrode and the second electrode thereof may be a drain electrode, but the present disclosure is not limited thereto.

Each of the first transistor ST1, the second transistor ST2, the fifth transistor ST5, the sixth transistor ST6, and the seventh transistor ST7 may include a silicon-based semiconductor region. For example, each of the first transistor ST1, the second transistor ST2, the fifth transistor ST5, the sixth transistor ST6, and the seventh transistor ST7 may include a semiconductor region made of low temperature polycrystalline silicon (LTPS). The semiconductor region made of low temperature polycrystalline silicon may have high electron mobility and excellent turn-on characteristics. That is, since the display device 10 includes the first transistor ST1, the second transistor ST2, the fifth transistor ST5, the sixth transistor ST6, and the seventh transistor ST7 having superior turn-on characteristics, it is possible to drive the plurality of pixels SP in a stable and efficient manner.

Each of the first transistor ST1, the second transistor ST2, the fifth transistor ST5, the sixth transistor ST6, and the seventh transistor ST7 may correspond to a p-type transistor. For example, each of the first transistor ST1, the second transistor ST2, the fifth transistor ST5, the sixth transistor ST6, and the seventh transistor ST7 may output a current flowing into the first electrode thereof to the second electrode thereof based on a gate low voltage applied to the gate electrode thereof.

Each of the third transistor ST3 and the fourth transistor ST4 may include an oxide-based semiconductor region. For example, each of the third transistor ST3 and the fourth transistor ST4 may have a coplanar structure in which the gate electrode is disposed on the oxide-based semiconductor region. The transistor having a coplanar structure may have excellent leakage current characteristics and perform low frequency driving, thereby reducing power consumption. Accordingly, the display device 10 may include the third transistor ST3 and the fourth transistor ST4 having excellent leakage current characteristics, thereby preventing a leakage current from flowing in the pixel, and stably maintaining the voltage in the pixel.

Each of the third transistor ST3 and the fourth transistor ST4 may correspond to an n-type transistor. For example, each of the third transistor ST3 and the fourth transistor ST4 may output a current flowing through the first electrode thereof to the second electrode thereof based on a gate high voltage applied to the gate electrode thereof.

The capacitor CST may be connected between the third node N3, which is the gate electrode of the first transistor ST1, and the driving voltage line VDDL. For example, the first capacitor electrode of the capacitor CST may be connected to the third node N3, and the second capacitor electrode of the capacitor CST may be connected to the driving voltage line VDDL, thereby maintaining a potential difference between the driving voltage line VDDL and the gate electrode of the first transistor ST1.

Figure 7:
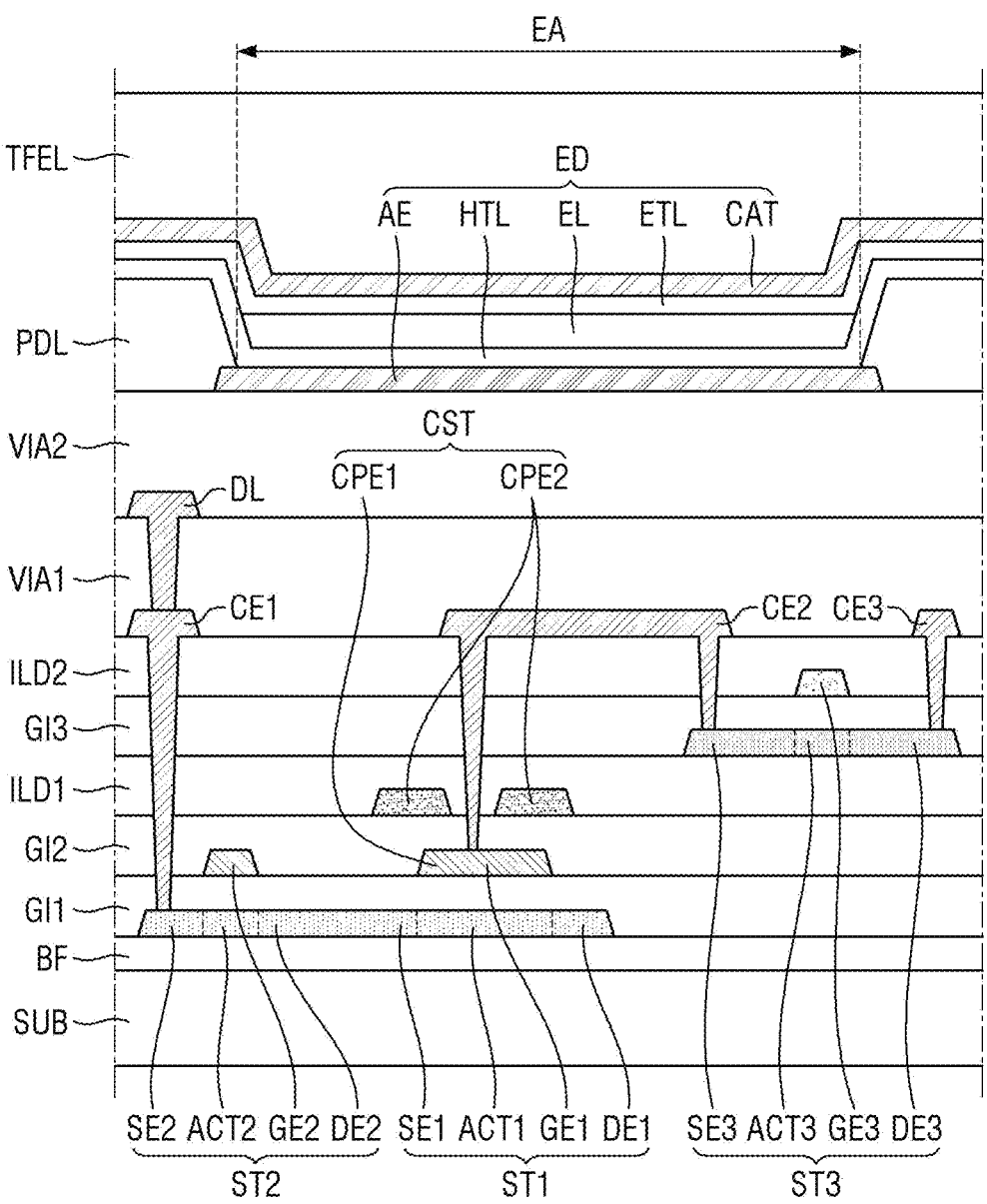
FIG. 7 is a cross-sectional view illustrating a pixel of a display device according to one embodiment.

FIG. 7 is a cross-sectional view illustrating a pixel of a display device according to one embodiment.

Referring to FIG. 7, the display panel 100 may include a substrate SUB, a buffer layer BF, a first active layer ACTL1, a first gate insulating layer GI1, a first gate layer GTL1, a second gate insulating layer GI2, a second gate layer GTL2, a first interlayer insulating layer ILD1, a second active layer ACTL2, a third gate insulating layer GI3, a third gate layer GTL3, a second interlayer insulating layer ILD2, a first source metal layer SDL1, a first via layer VIA1, a second source metal layer SDL2, a second via layer VIA2, a pixel defining layer PDL, a light emitting element ED, and an encapsulation layer TFEL.

The substrate SUB may be a base substrate or a base member. The substrate SUB may be a flexible substrate which can be bent, folded or rolled. For example, the substrate SUB may include a polymer resin such as polyimide (PI), but is not limited thereto. For another example, the substrate SUB may include a glass material or a metal material.

The buffer layer BF may be disposed on the substrate SUB. For example, the buffer layer BF may include an inorganic layer capable of preventing permeation of air or moisture. For example, the buffer layer BF may include a plurality of inorganic layers alternately stacked.

The first active layer ACTL1 may be disposed on the buffer layer BF. The first active layer ACTL1 may include a silicon-based material. For example, the first active layer ACTL1 may be formed of low temperature polycrystalline silicon (LTPS). The first active layer ACTL1 may include a semiconductor region ACT1, a first electrode SE1, and a second electrode DE1 of the first transistor ST1, and a semiconductor region ACT2, a first electrode SE2 and a second electrode DE2 of the second transistor ST2.

The first gate insulating layer GI1 may be disposed on the first active layer ACTL1. The first gate insulating layer GI1 may insulate the first active layer ACTL1 from the first gate layer GTL1.

The first gate layer GTL1 may be disposed on the first gate insulating layer GI1. The first gate layer GTL1 may include the gate electrode GE1 of the first transistor ST1, the gate electrode GE2 of the second transistor ST2, and the first capacitor electrode CPE1. The gate electrode GE1 of the first transistor ST1 may be a part of the first capacitor electrode CPE1, and the gate electrode GE2 of the second transistor ST2 may be a part of the first gate line GWL.

The second gate insulating layer GI2 may be disposed on the first gate layer GTL1. The second gate insulating layer GI2 may insulate the first gate layer GTL1 from the second gate layer GTL2.

The second gate layer GTL2 may be disposed on the second gate insulating layer GI2. The second gate layer GTL2 may include a second capacitor electrode CPE2. The second capacitor electrode CPE2 may overlap the first capacitor electrode CPE1.

The first interlayer insulating layer ILD1 may be disposed on the second gate layer GTL2. The first interlayer insulating layer ILD1 may insulate the second gate layer GTL2 from the second active layer ACTL2.

The second active layer ACTL2 may be disposed on the first interlayer insulating layer ILD1. The second active layer ACTL2 may include an oxide-based material. The second active layer ACTL2 may include a third semiconductor region ACT3, a first electrode DE3, and a second electrode SE3 of the third transistor ST3.

The third gate insulating layer GI3 may be disposed on the second active layer ACTL2. The third gate insulating layer GI3 may insulate the second active layer ACTL2 from the third gate layer GTL3.

The third gate layer GTL3 may be disposed on the third gate insulating layer GI3. The third gate layer GTL3 may include a gate electrode GE3 of the third transistor ST3. The gate electrode GE3 of the third transistor ST3 is a portion of the second gate line GCL.

The second interlayer insulating layer ILD2 may be disposed on the third gate layer GTL3. The second interlayer insulating layer ILD2 may insulate the third gate layer GTL3 from the first source metal layer SDL1.

The first source metal layer SDL1 may be disposed on the second interlayer insulating layer ILD2. The first source metal layer SDL1 may include first to third connection electrodes CE1, CE2, and CE3. The first connection electrode CE1 may electrically connect the data line DL and the first electrode SE2 of the second transistor ST2. The second connection electrode CE2 may electrically connect the first capacitor electrode CPE1 and the second electrode SE3 of the third transistor ST3. The third connection electrode CE3 may electrically connect the first electrode DE3 of the third transistor ST3 and the second electrode DE1 of the first transistor ST1.

The first via layer VIA1 may be disposed on the first source metal layer SDL1. The first via layer VIA1 may insulate the first source metal layer SDL1 and the second source metal layer SDL2. The top surface of the first via layer VIA1 may be flat. The first via layer VIA1 may include an organic insulating material such as polyimide (PI).

The second source metal layer SDL2 may be disposed on the first via layer VIA1. The second source metal layer SDL2 may include a data line DL.

The second via layer VIA2 may be disposed on the second source metal layer SDL2. The second via layer VIA2 may insulate the second source metal layer SDL2 and a pixel electrode AE. The top surface of the second via layer VIA2 may be flat. The second via layer VIA2 may include an organic insulating material such as polyimide (PI).

The pixel defining layer PDL may be disposed on the second via layer VIA2. The pixel defining layer PDL may define a plurality of emission areas EA. The pixel defining layer PDL may include an organic insulating material such as polyimide (PI).

The light emitting element ED may include a pixel electrode AE, a hole transporting layer HTL, a light emitting layer EL, an electron transporting layer ETL, and a common electrode CAT. The pixel electrode AE may be disposed on the second via layer VIA2. The pixel electrode AE may overlap one of the plurality of emission areas EA defined by the pixel defining layer PDL. The pixel electrode AE may receive a driving current from the pixel circuit of the pixel SP.

The hole transporting layer HTL may be disposed on the pixel electrode AE in the emission area EA and may be disposed on the pixel defining layer PDL in the non-emission area NEA. The hole transporting layer HTL may not be divided for each pixel SP, but may be implemented as a common layer for multiple pixels SP and the fingerprint sensor OPD.

The light emitting layer EL may be disposed on the hole transporting layer HTL in the emission area EA. For example, the light emitting layer EL may be an organic light emitting layer made of an organic material, but is not limited thereto.

The electron transporting layer ETL may be disposed on the light emitting layer EL in the emission area EA, and may be disposed on the hole transporting layer HTL in the non-emission area NEA. The electron transporting layer ETL may not be divided for each pixel SP, but may be implemented as a common layer for the entire pixels SP and the fingerprint sensor OPD.

The common electrode CAT may be disposed on the electron transporting layer ETL. For example, the common electrode CAT may be implemented in the form of an electrode common to all pixels SP rather than being separate for each of the plurality of pixels SP. The common electrode CAT may be a transparent electrode and may transmit light. The common electrode CAT may be electrically connected to the bias voltage line VBL and may receive a bias voltage, a low potential voltage, a common voltage, or a cathode voltage.

In the case of employing the organic light emitting layer as the light emitting layer EL, the pixel circuit of the pixel SP applies a predetermined voltage to the pixel electrode AE, and if the common electrode CAT receives a common voltage or a cathode voltage, the holes and electrons can move to the light emitting layer EL through the hole transporting layer HTL and the electron transporting layer ETL, respectively, and combine to produce light to be emitted by the light emitting layer EL.

The encapsulation layer TFEL may be disposed on the common electrode CAT to cover the plurality of light emitting elements ED. The encapsulation layer TFEL may include at least one inorganic layer to prevent oxygen or moisture from penetrating into the plurality of light emitting elements ED. The encapsulation layer TFEL may include at least one organic layer to protect the plurality of light emitting elements ED from foreign matters such as dust.

Figure 8:
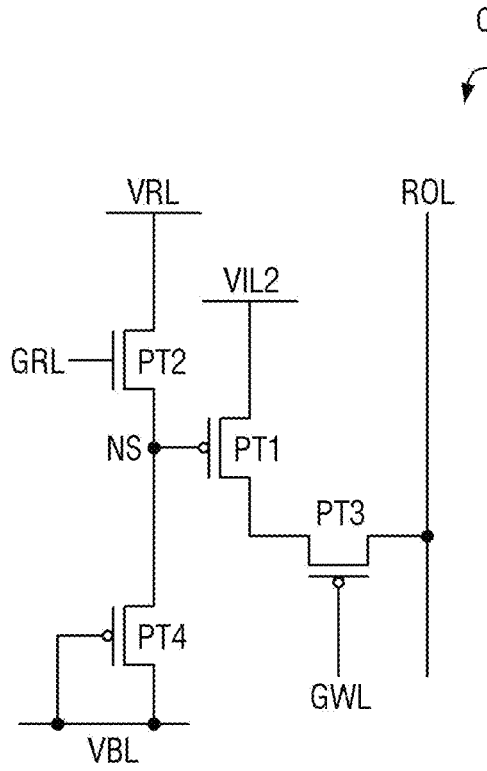
FIG. 8 is a circuit diagram illustrating a fingerprint sensor of a display device according to one embodiment.
Figure 9:
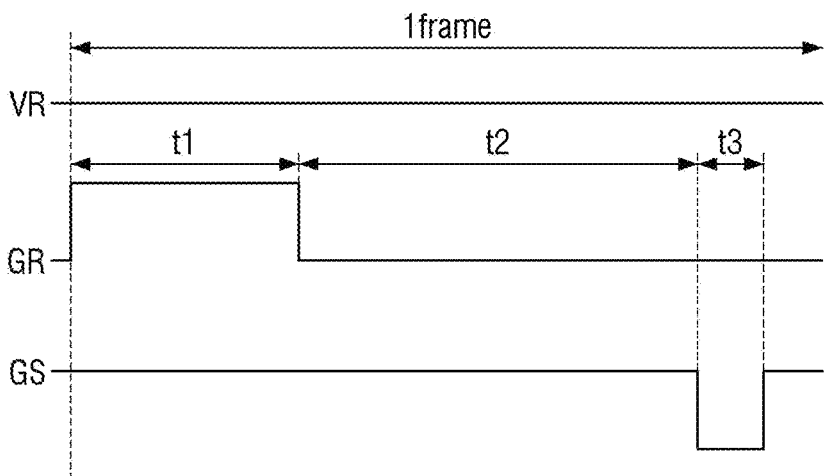
FIG. 9 is a waveform diagram of signals supplied to a fingerprint sensor illustrated in FIG. 8.
Figure 10:
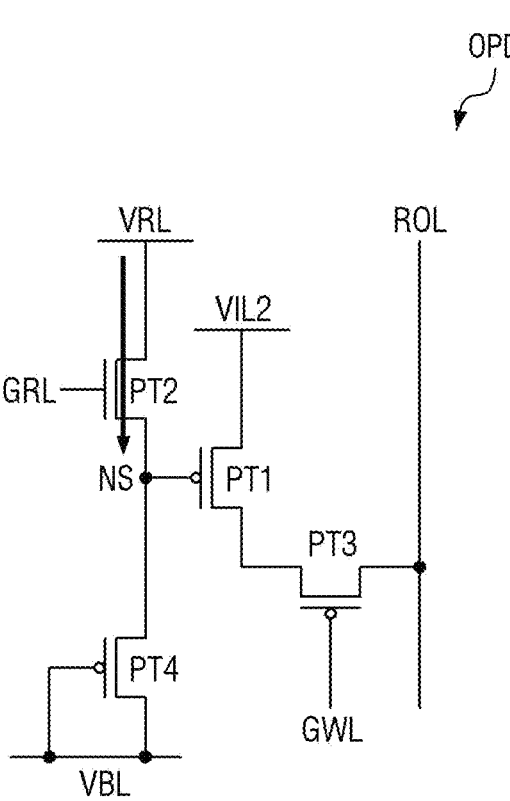
FIG. 10 is a circuit diagram illustrating an operation of a fingerprint sensor during a first period of FIG. 9.
Figure 11:
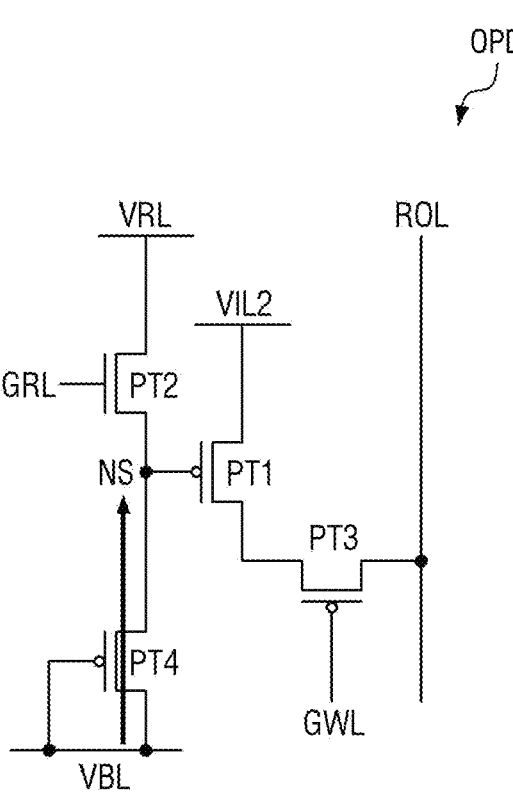
FIG. 11 is a circuit diagram illustrating an operation of a fingerprint sensor during a second period of FIG. 9.
Figure 12:
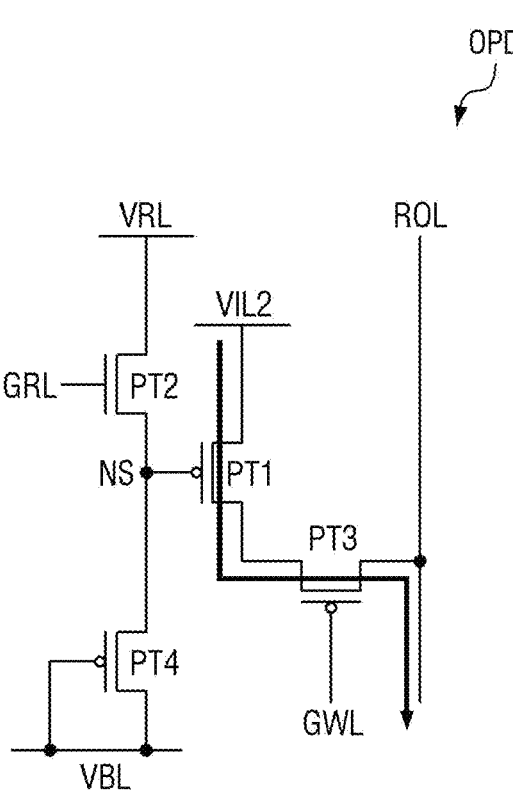
FIG. 12 is a circuit diagram illustrating an operation of a fingerprint sensor during a third period of FIG. 9.
Figure 13:
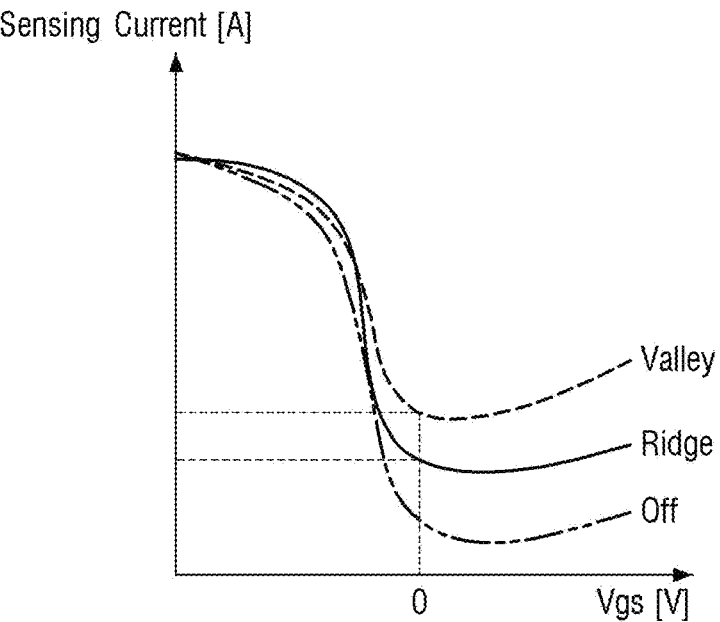
FIG. 13 is a graph illustrating a magnitude of leakage current flowing in a fourth sensor transistor of FIG. 8.

FIG. 8 is a circuit diagram illustrating a fingerprint sensor of a display device according to one embodiment, and FIG. 9 is a waveform diagram of signals supplied to a fingerprint sensor illustrated in FIG. 8. FIG. 10 is a circuit diagram illustrating an operation of a fingerprint sensor during a first period of FIG. 9, FIG. 11 is a circuit diagram illustrating an operation of a fingerprint sensor during a second period of FIG. 9, and FIG. 12 is a circuit diagram illustrating an operation of a fingerprint sensor during a third period of FIG. 9. FIG. 13 is a graph illustrating a magnitude of leakage current flowing in a fourth sensor transistor of FIG. 8.

Referring to FIGS. 8 to 13, the fingerprint sensor OPD may include a first gate line GWL, a reset voltage line VRL, a second initialization voltage line VIL2, a bias voltage line VBL, and a read-out lines ROL.

The fingerprint sensor OPD may include first to fourth sensor transistors PT1, PT2, PT3, and PT4.

The first sensor transistor PT1 may include a gate electrode, a first electrode, and a second electrode. The gate electrode of the first sensor transistor PT1 may be connected to a sensor node NS, the first electrode thereof may be connected to the third sensor transistor PT3, and the second electrode thereof may be connected to the second initialization voltage line VIL2. The first sensor transistor PT1 may control a source-drain current (hereinafter referred to as a "sensing current") according to a voltage of the sensor node NS. The sensing current Isd flowing through the channel of the first sensor transistor PT1 may be proportional to the square of the difference between the threshold voltage Vth and the voltage Vsg between the source electrode and the gate electrode of the first sensor transistor PT1 (Isd=k'× (Vsg−Vth)$^2$), where k denotes a proportional coefficient determined by the structure and physical properties of the first sensor transistor PT1, Vsg denotes the source-gate voltage of the first sensor transistor PT1, and Vth denotes the threshold voltage of the first sensor transistor PT1. The first electrode of the first sensor transistor PT1 may be a source electrode and the second electrode thereof may be a drain electrode, but the present disclosure is not limited thereto.

The second sensor transistor PT2 may be turned on by a reset signal on a reset signal line GRL to electrically connect the sensor node NS to the reset voltage line VRL. The gate electrode of the second sensor transistor PT2 may be connected to the reset signal line GRL, the first electrode thereof may be connected to the sensor node NS, and the second electrode thereof may be connected to the reset voltage line VRL. The second sensor transistor PT2 may receive a reset voltage from the reset voltage line VRL. The first electrode of the second sensor transistor PT2 may be connected to the second electrode of the fourth sensor transistor PT4 and the gate electrode of the first sensor transistor PT1 through the sensor node NS. The first electrode of the second sensor transistor PT2 may be a drain electrode and the second electrode thereof may be a source electrode, but the present disclosure is not limited thereto.

The third sensor transistor PT3 may be turned on by a first gate signal on the first gate line GWL to electrically connect the first electrode of the first sensor transistor PT1 and the read-out line ROL. The gate electrode of the third sensor transistor PT3 may be connected to the first gate line GWL, the first electrode thereof may be connected to the read-out line ROL, and the second electrode thereof may be connected to the first electrode of the first sensor transistor PT1. The first electrode of the third sensor transistor PT3 may be a source electrode and the second electrode thereof may be a drain electrode, but the present disclosure is not limited thereto.

The fourth sensor transistor PT4 may be connected between the bias voltage line VBL and the sensor node NS. The gate electrode and the first electrode of the fourth sensor transistor PT4 may be connected to the bias voltage line VBL and the second electrode thereof may be connected to the sensor node NS. The first electrode of the fourth sensor transistor PT4 may be a source electrode and the second electrode thereof may be a drain electrode, but the present disclosure is not limited thereto. Since the gate electrode and the first electrode of the fourth sensor transistor PT4 receives a bias voltage from the bias voltage line VBL, a gate-source voltage Vgs of the fourth sensor transistor PT4 may be zero. If the fourth sensor transistor PT4 does not receive light, the fourth sensor transistor PT4 may be turned off. In FIG. 13, when the fourth sensor transistor PT4 is turned off, small amount of leakage current may flow but may not affect the operation of the fingerprint sensor OPD.

The fourth sensor transistor PT4 may be a photo transistor. The fourth sensor transistor PT4 may recognize the pattern of the user's fingerprint based on the light reflected from the user's fingerprint. When the user's fingerprint touches the display panel 100, the fourth sensor transistor PT4 may receive light reflected by the ridges or valleys of the fingerprint. The light output from the light emitting element ED may be reflected by the ridges or valleys of the fingerprint, and the reflected light may reach the fourth sensor transistor PT4. The fourth sensor transistor PT4 may convert the energy of light into an electrical signal (current or voltage) formed between the first electrode and the second electrode, and the converted electrical signal is a reverse bias current that may flow from the bias voltage line VBL to the sensor node NS. For example, when the fourth sensor transistor PT4 receives light and an electric field is formed between the first and second electrodes of the fourth sensor transistor PT4, a current may flow through the fourth sensor transistor PT4 in proportion to the amount of light, and the voltage of the sensor node NS may increase. Accordingly, when the fourth sensor transistor PT4 receives light, the voltage of the sensor node NS may increase, and the magnitude of the sensing current (or source-drain current) of the first sensor transistor PT1 may decrease. The sensing current of the first sensor transistor PT1 may be applied to the display driver 200 as a sensing signal through the third sensor transistor PT3 and the read-out line ROL.

Each of the first sensor transistor PT1, third sensor transistor PT3, and fourth sensor transistor PT4 may include a silicon-based semiconductor region. The semiconductor region of each of the first sensor transistors PT1, the third sensor transistor PT3, and the fourth sensor transistor PT4 may be disposed in the first active layer ACTL1 of FIG. 7. For example, each of the first sensor transistor PT1, the third sensor transistor PT3, and the fourth sensor transistor PT4 may include a semiconductor region formed of low temperature polycrystalline silicon (LTPS). The semiconductor region made of low-temperature polycrystalline silicon may have high electron mobility and excellent turn-on characteristics. Accordingly, as the display device 10 includes the first sensor transistor PT1, the third sensor transistor PT3, and a fourth sensor transistor PT4 with excellent turn-on characteristics, the plurality of fingerprint sensors OPD may be operated stably and efficiently.

Each of the first sensor transistor PT1, the third sensor transistor PT3, and the fourth sensor transistor PT4 may correspond to a p-type transistor. For example, each of the first sensor transistor PT1, the third sensor transistor PT3, and the fourth sensor transistor PT4 may output the current flowing through the first electrode to the second electrode based on the gate low voltage applied to the gate electrode.

The second sensor transistor PT2 may include an oxide-based semiconductor region. For example, the second sensor transistor PT2 may have a coplanar structure in which the gate electrode is disposed on the oxide-based semiconductor region. The transistor having a coplanar structure may have excellent leakage current characteristics and perform low frequency driving, thereby reducing power consumption. Accordingly, the display device 10 may include the second sensor transistor PT2 having excellent leakage current characteristics, thereby preventing a leakage current from flowing in the fingerprint sensor OPD, and stably maintaining the voltage in the sensor node NS.

The second sensor transistor PT2 may correspond to an n-type transistor. For example, the second sensor transistor PT2 may output a current flowing through the first electrode thereof to the second electrode thereof based on the gate high voltage applied to the gate electrode thereof.

Referring to FIG. 9 in conjunction with FIGS. 10 to 12, the fingerprint sensor OPD may be driven at a predetermined frequency, and one frame period may include first to third periods t1 to t3.

In FIG. 10, the second sensor transistor PT2 may receive a high-level reset signal GR during the first period t1. The second sensor transistor PT2 may be turned on based on the high-level reset signal GR and may discharge the sensor node NS to a reset voltage VR. The magnitude of the reset voltage VR of the reset voltage line VRL may be smaller than the magnitude of the bias voltage of the bias voltage line VBL.

In FIG. 11, the fourth sensor transistor PT4 may receive reflected light during the second period t2 and supply leakage current to the sensor node NS. As the intensity of reflected light becomes stronger, the magnitude of leakage current may increase. In FIG. 13, the fourth sensor transistor PT4 may receive light reflected from the valley of the fingerprint and supply a relatively great leakage current to the sensor node NS. The fourth sensor transistor PT4 may receive light reflected from the ridges of the fingerprint and supply a relatively small leakage current to the sensor node NS.

In FIG. 12, the third sensor transistor PT3 may receive a low level first gate signal GS during the third period t3. The third sensor transistor PT3 may be turned on based on the low level first gate signal GS, and the sensing current of the first sensor transistor PT1 may be applied to the display driver 200 through the third sensor transistor PT3 and the read-out lines ROL. Accordingly, the voltage of the sensor node NS may change depending on the magnitude of the leakage current, and sensing signals of different sizes corresponding to the valleys and ridges of the fingerprint may be applied to the display driver 200.

As the gate electrode and the first electrode of the fourth sensor transistor PT4 are connected to the bias voltage line VBL, the fourth sensor transistor PT4 may be turned off when it does not receive the reflected light, and supply the leakage current to the sensor node NS when it receives the reflected light. Accordingly, the fourth sensor transistor PT4 may minimize the leakage current flowing to easily distinguish the voltage of the sensor node NS and improve the sensitivity of the fingerprint sensor OPD.

Figure 14:
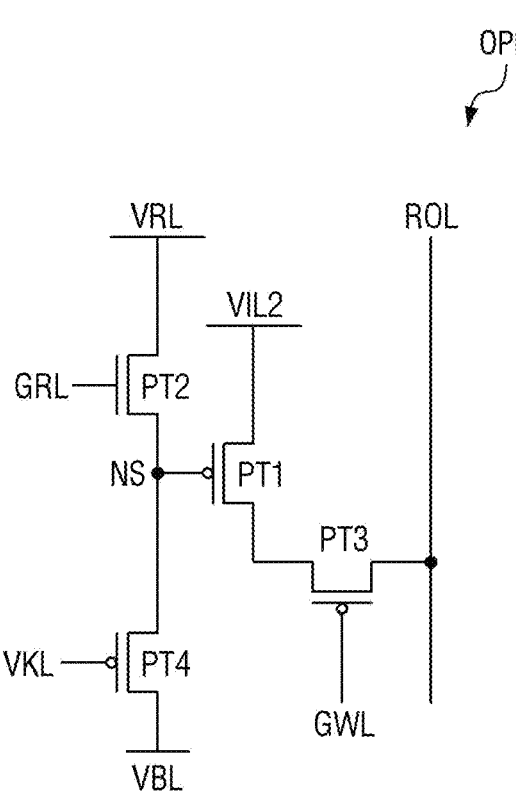
FIG. 14 is a circuit diagram illustrating a fingerprint sensor of a display device according to another embodiment.

FIG. 14 is a circuit diagram illustrating a fingerprint sensor of a display device according to another embodiment. The fingerprint sensor of FIG. 14 differs from FIG. 8 in the configuration of the fourth sensor transistor PT4. The parts of the circuit diagram of FIG. 14 that is the same as the above-described configuration will be described briefly or be omitted.

Referring to FIG. 14, the fingerprint sensor OPD may be connected to the first gate line GWL, the reset signal line GRL, the reset voltage line VRL, the second initialization voltage line VIL2, the bias voltage line VBL, a leakage voltage line VKL, and the read-out line ROL.

The fingerprint sensor OPD may include first to fourth sensor transistors PT1, PT2, PT3, and PT4.

The gate electrode of the first sensor transistor PT1 may be connected to the sensor node NS, the first electrode thereof may be connected to the third sensor transistor PT3, and the second electrode thereof may be connected to the second initialization voltage line VIL2. The first sensor transistor PT1 may control the source-drain current Isd (hereinafter, referred to as "sensing current") based on the voltage of the sensor node NS.

The second sensor transistor PT2 may be turned on by a reset signal of the reset signal line GRL to electrically connect the sensor node NS and the reset voltage line VRL. The gate electrode of the second sensor transistor PT2 may be connected to the reset signal line GRL, the first electrode thereof may be connected to the sensor node NS, and the second electrode thereof may be connected to the reset voltage line VRL.

The third sensor transistor PT3 may be turned on by a first gate signal of the first gate line GWL to electrically connect the first electrode of the first sensor transistor PT1 and the read-out line ROL. The gate electrode of the third sensor transistor PT3 may be connected to the first gate line GWL, the first electrode thereof may be connected to the read-out line ROL, and the second electrode thereof may be connected to the first electrode of the first sensor transistor PT1.

The fourth sensor transistor PT4 may be connected between the bias voltage line VBL and the sensor node NS. The gate electrode of the fourth sensor transistor PT4 may be connected to the leakage voltage line VKL, the first electrode thereof may be connected to the bias voltage line VBL, and the second electrode thereof may be connected to the sensor node NS. The first electrode of the fourth sensor transistor PT4 may be a source electrode and the second electrode thereof may be a drain electrode, but the present disclosure is not limited thereto.

The magnitude of the leakage voltage of the leakage voltage line VKL may be greater than the magnitude of the bias voltage of the bias voltage line VBL, and a gate-source voltage Vgs of the fourth sensor transistor PT4 may be greater than zero. Referring to FIG. 13, the gate-source voltage Vgs of the fourth sensor transistor PT4 of FIG. 14 may be greater than the gate-source voltage Vgs of the fourth sensor transistor PT4 of FIG. 8. Accordingly, the fingerprint sensor OPD of FIG. 14 may have a big difference in leakage current corresponding to the valleys and ridges of the fingerprint, and may easily distinguish the voltage of the sensor node NS to improve the sensitivity of the fingerprint sensor OPD.

Figure 15:
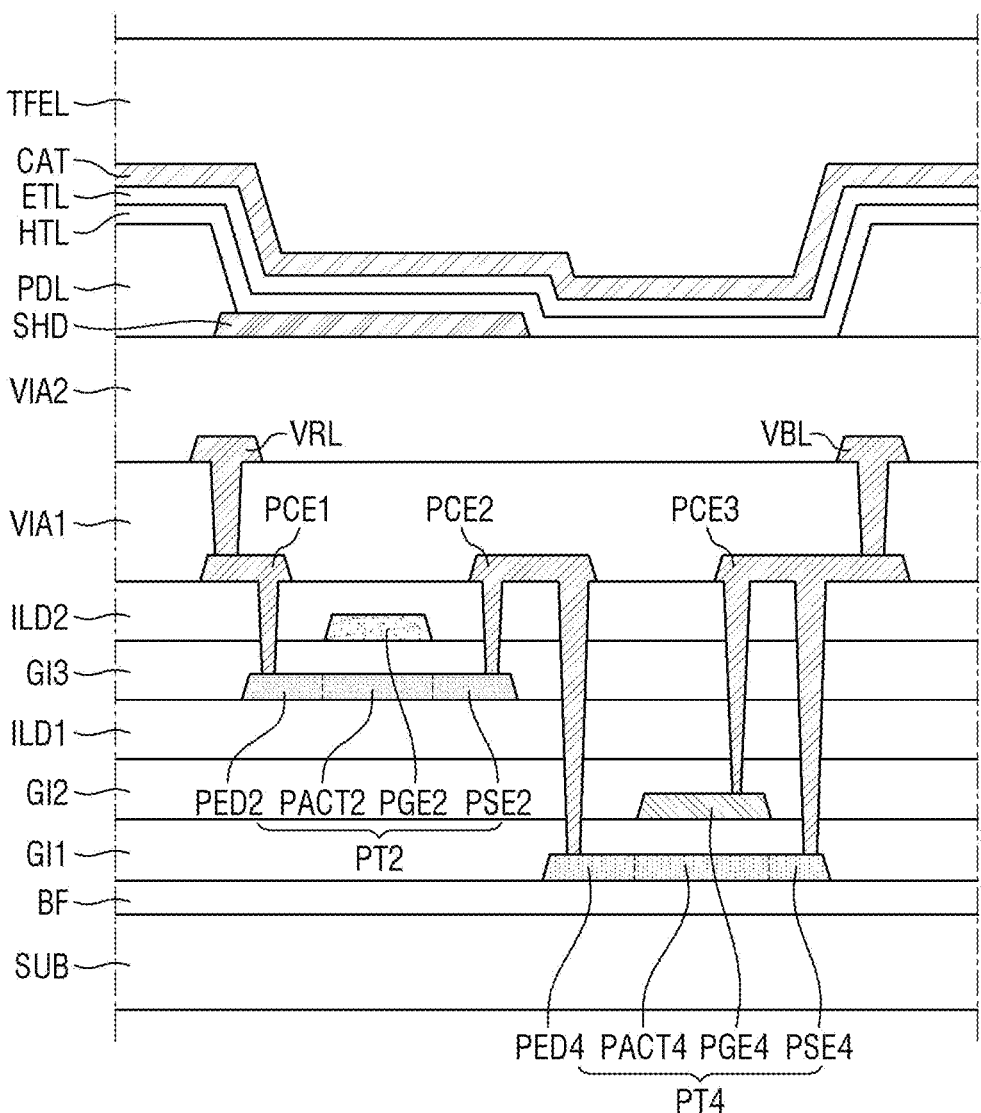
FIG. 15 is a cross-sectional view illustrating a portion of a fingerprint sensor in a display device according to one embodiment.

FIG. 15 is a cross-sectional view illustrating a portion of a fingerprint sensor in a display device according to one embodiment. The same configurations as the above-described configurations will be briefly described, or a description thereof will be omitted.

Referring to FIG. 15, the display panel 100 may include a substrate SUB, a buffer layer BF, a first active layer ACTL1, a first gate insulating layer GI1, a first gate layer GTL1, a second insulating layer GI2, a first interlayer insulating layer ILD1, a second active layer ACTL2, a third gate insulating layer GI3, a third gate layer GTL3, a second interlayer insulating layer ILD2, a first source metal layer SDL1, a first via layer VIA1, a second source metal layer SDL2, a second via layer VIA2, a pixel defining layer PDL, a shielding electrode SHD, and an encapsulation layer TFEL.

The first active layer ACTL1 may be disposed on the buffer layer BF. The first active layer ACTL1 may include a silicon-based material. For example, the first active layer ACTL1 may be made of low-temperature polycrystalline silicon (LTPS). The first active layer ACTL1 may include a semiconductor region PACT4, a first electrode PSE4, and a second electrode PDE4 of the fourth sensor transistor PT4.

The first gate layer GTL1 may be disposed on the first gate insulating layer GI1. The first gate layer GTL1 may include a gate electrode PGE4 of the fourth sensor transistor PT4.

The second active layer ACTL2 may be disposed on the first interlayer insulating layer ILD1. The second active layer ACTL2 may include an oxide-based material. The second active layer ACTL2 may include a semiconductor region PACT2, a first electrode PDE2, and a second electrode PSE2 of the second sensor transistor PT2.

The third gate layer GTL3 may be disposed on the third gate insulating layer G13. The third gate layer GTL3 may include a gate electrode PGE2 of the second sensor transistor PT2. The gate electrode PGE2 of the second sensor transistor PT2 may be a part of the reset signal line GRL.

The first source metal layer SDL1 may be disposed on the second interlayer insulating layer ILD2. The first source metal layer SDL1 may include first to third sensor connection electrodes PCE1, PCE2, and PCE3. The first sensor connection electrode PCE1 may electrically connect the reset voltage line VRL and the first electrode PDE2 of the second sensor transistor PT2. The second sensor connection electrode PCE2 may electrically connect the second electrode PSE2 of the second sensor transistor PT2 and the second electrode PDE4 of the fourth sensor transistor PT4. The third sensor connection electrode PCE3 may electrically connect the gate electrode PGE4 and the first electrode PSE4 of the fourth sensor transistor PT4 and the bias voltage line VBL.

The second source metal layer SDL2 may be disposed on the first via layer VIAL. The second source metal layer SDL2 may include the reset voltage line VRL and the bias voltage line VBL.

The shielding electrode SHD may be disposed on the second via layer VIA2 and on the same line as a pixel electrode AE of the light emitting element ED. The shielding electrode SHD may overlap the first to third sensor transistors PT1, PT2, and PR3, and without overlapping the fourth sensor transistor PT4. In some embodiments, the shielding electrode SHD may cover a different part of the substrate SUB than the fourth sensor transistor PT4.

The hole transporting layer HTL may be disposed on the shielding electrode SHD. The hole transporting layer HTL may not be divided for each pixel SP, but may be implemented as a common layer for the entire pixels SP and the fingerprint sensor OPD.

An electron transporting layer ETL may be disposed on the hole transporting layer HTL. The electron transporting layer ETL may not be divided for each pixel SP, but may be implemented as a common layer for the entire pixels SP and the fingerprint sensor OPD.

A common electrode CAT may be disposed on the electron transporting layer ETL. For example, the common electrode CAT may not be divided for each of the plurality of pixels SP, but may be implemented in a form of an electrode common to the entire pixels SP. The common electrode CAT may be a transparent electrode and may transmit light.

The fingerprint sensor OPD may include a hole transporting layer HTL and an electron transporting layer ETL that are each implemented as a common layer of the entire pixel SP and the fingerprint sensor OPD, but may include the fourth sensor transistor PT4, which is a photo transistor, without including a separate light receiving element disposed on the same layer, thereby minimizing the leakage current flowing through the fingerprint sensor OPD and improving the sensitivity of the fingerprint sensor OPD even in a high-resolution structure with dense pixels SP and the fingerprint sensor OPD.

Figure 16:
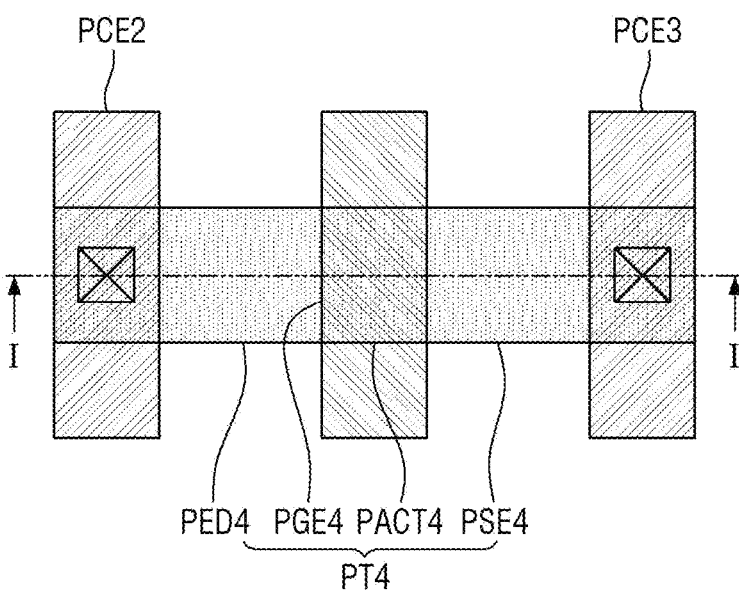
FIG. 16 is a plan view illustrating one example of a fourth sensor transistor of a fingerprint sensor in a display device according to one embodiment.
Figure 17:
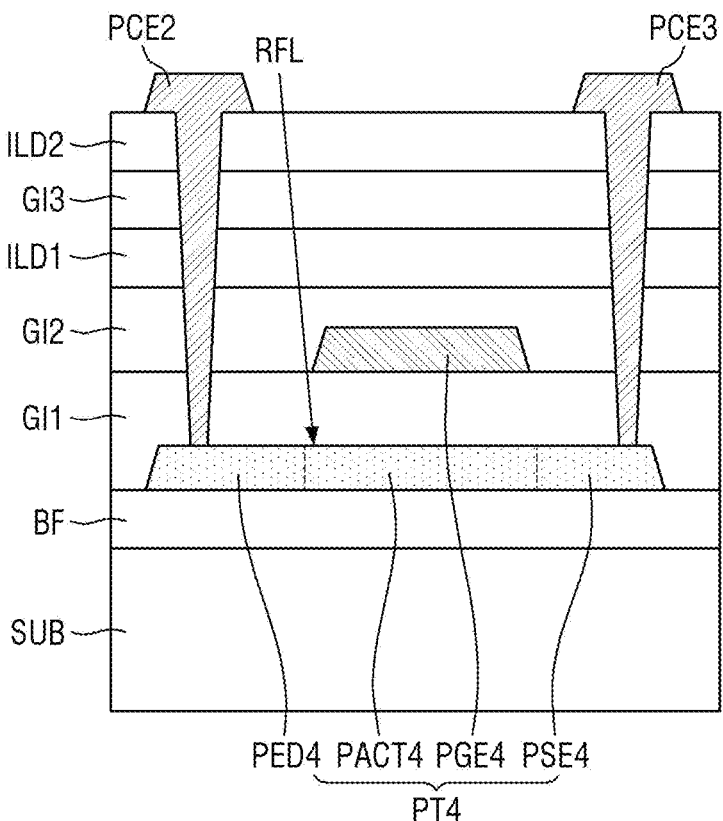
FIG. 17 is a cross-sectional view taken along line I-I' of FIG. 16.

FIG. 16 is a plan view illustrating one example of a fourth sensor transistor of a fingerprint sensor in a display device according to one embodiment, and FIG. 17 is a cross-sectional view taken along line I-I' of FIG. 16. The same configuration as the above-described configuration will be described briefly, or a description thereof will be omitted.

Referring to FIGS. 16 and 17, the fourth sensor transistor PT4 may be a photo transistor. The fourth sensor transistor PT4 may recognize the pattern of the user's fingerprint based on light RFL reflected from the user's fingerprint. When the user's fingerprint touches the display panel 100, the fourth sensor transistor PT4 may receive the light RFL reflected by the ridges or valleys of the fingerprint. The light outputted from the light emitting element ED may be reflected by the ridges or valleys of the fingerprint, and the reflected light RFL may reach the fourth sensor transistor PT4. The fourth sensor transistor PT4 may convert the energy of light into an electrical signal (current or voltage) formed between the first electrode and the second electrode, and the converted electrical signal is a reverse bias current that may flow from the bias voltage line VBL to the sensor node NS. For example, when the fourth sensor transistor PT4 receives light and an electric field is formed between the first and second electrodes of the fourth sensor transistor PT4, a current may flow through the fourth sensor transistor PT4 in proportion to the amount of light, and the voltage of the sensor node NS may increase. Accordingly, when the fourth sensor transistor PT4 receives light, the voltage of the sensor node NS may increase and the magnitude of the sensing current (or source-drain current) of the first sensor transistor PT1 may decrease. The sensing current of the first sensor transistor PT1 may be applied to the display driver 200 as a sensing signal through the third sensor transistor PT3 and the read-out line ROL.

Figure 18:
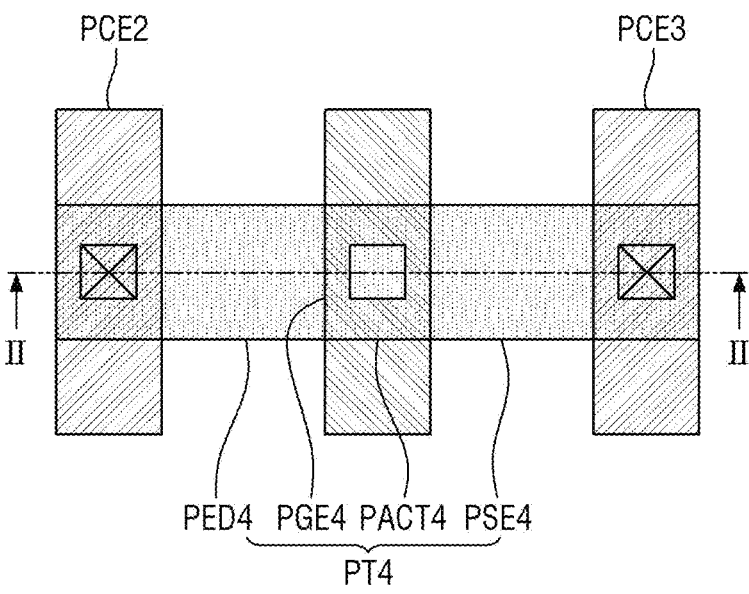
FIG. 18 is a plan view illustrating another example of a fourth sensor transistor of a fingerprint sensor in a display device according to one embodiment.
Figure 19:
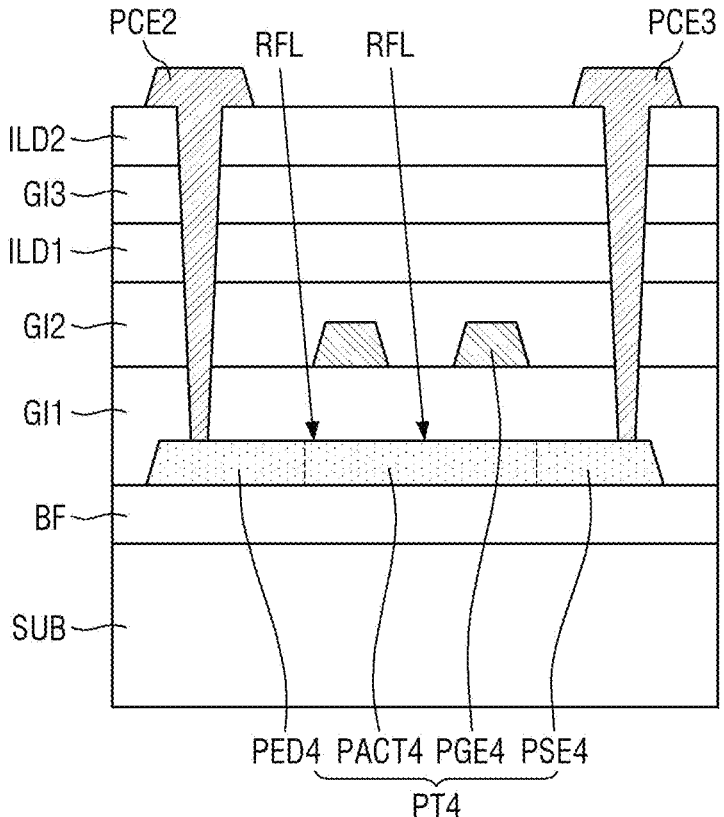
FIG. 19 is a cross-sectional view taken along line II-II' of FIG. 18.

FIG. 18 is a plan view illustrating another example of a fourth sensor transistor of a fingerprint sensor in a display device according to one embodiment, and FIG. 19 is a cross-sectional view taken along line II-II' of FIG. 18.

Referring to FIGS. 18 and 19, the gate electrode PGE4 of the fourth sensor transistor PT4 may include a hole, unlike in the embodiment of FIG. 16 and FIG. 17. A portion of the semiconductor region PACT4 of the fourth sensor transistor PT4 may not overlap the gate electrode PGE4. The gate electrode PGE4 of the fourth sensor transistor PT4 may expose a portion of the semiconductor region PACT4 to the reflected light RFL. The semiconductor region PACT4 of the fourth sensor transistor PT4 of FIGS. 18 and 19 may receive more reflected light RFL than the semiconductor region PACT4 of the fourth sensor transistor PT4 of FIGS. 16 and 17. Accordingly, the amount of leakage current of the fourth sensor transistor PT4 of FIGS. 18 and 19 may increase, and the difference in leakage current corresponding to the valleys and ridges of the fingerprint may be large. The fingerprint sensor OPD may easily distinguish the voltage of the sensor node NS to improve the sensitivity of the fingerprint sensor OPD.

The effects of the present disclosure are not restricted to the one set forth herein. The above and other effects of the present disclosure will become more apparent to one of ordinary skill in the art to which the present disclosure pertains by referencing the claims.

What is claimed is:

1. A fingerprint sensor comprising:
a read-out line disposed on a substrate and extending in a first direction;
a first sensor transistor controlling a sensing current based on a voltage of a sensor node;
a second sensor transistor supplying a reset voltage to the sensor node based on a reset signal;
a third sensor transistor electrically connected a first electrode of the first sensor transistor and the read-out line based on a gate signal;
a fourth sensor transistor comprising a gate electrode connected to a bias voltage line, a first electrode connected to the bias voltage line, and a second electrode connected to the sensor node, and wherein a leakage current which flows through the fourth sensor transistor in proportion to the amount of light is applied to the sensor node to increase the voltage of the sensor node;
a first active layer disposed on the substrate and comprising a semiconductor region of each of the first sensor transistor, the third sensor transistor, and the fourth sensor transistor;
a first gate layer disposed on the first active layer;
a second gate layer disposed on the first gate layer;
a second active layer disposed on the second gate layer and comprising a semiconductor region of the second sensor transistor;
a third gate layer disposed on the second active layer;
a first source metal layer disposed on the third gate layer; and
a second source metal layer disposed on the first source metal layer.

2. The fingerprint sensor of claim 1,
wherein the second sensor transistor supplies the reset voltage to the sensor node during a first period,
wherein the fourth sensor transistor supplies the leakage current to the sensor node during a second period after the first period, and
wherein the third sensor transistor is turned on during a third period after the second period.

3. The fingerprint sensor of claim 1,
further comprising a shielding electrode disposed on the second source metal layer to overlap the second sensor transistor without overlapping the fourth sensor transistor.

4. The fingerprint sensor of claim 3, further comprising:
a hole transporting layer disposed on the shielding electrode to overlap the first to fourth sensor transistors;
an electron transporting layer disposed on the hole transporting layer to overlap the first to fourth sensor transistors; and
a common electrode disposed on the electron transporting layer to overlap the first to fourth sensor transistors.

5. The fingerprint sensor of claim 1,
wherein a gate electrode of the fourth sensor transistor comprises a hole exposing a portion of a semiconductor region from a reflected light.

6. A fingerprint sensor comprising:
a read-out line disposed on a substrate and extending in a first direction;
a first sensor transistor controlling a sensing current based on a voltage of a sensor node;
a second sensor transistor supplying a reset voltage to the sensor node based on a reset signal;
a third sensor transistor electrically connecting a first electrode of the first sensor transistor and the read-out line based on a gate signal;
a fourth sensor transistor comprising a gate electrode connected to a leakage voltage line to receive a leakage voltage, a first electrode connected to a bias voltage line to receive a bias voltage smaller than the leakage voltage, and a second electrode connected to the sensor node, and
wherein a leakage current which flows through the fourth sensor transistor in proportion to the amount of light is applied to the sensor node to increase the voltage of the sensor node;
a first active layer disposed on the substrate and comprising a semiconductor region of each of the first sensor transistor, the third sensor transistor, and the fourth sensor transistor;
a first gate layer disposed on the first active layer;
a second gate layer disposed on the first gate layer;
a second active layer disposed on the second gate layer and comprising a semiconductor region of the second sensor transistor;
a third gate layer disposed on the second active layer;
a first source metal layer disposed on the third gate layer; and
a second source metal layer disposed on the first source metal layer.

7. The fingerprint sensor of claim 6,
wherein the second sensor transistor supplies the reset voltage to the sensor node during a first period,
wherein the fourth sensor transistor supplies the leakage current to the sensor node during a second period after the first period, and
wherein the third sensor transistor is turned on during a third period after the second period.

8. The fingerprint sensor of claim 6,
further comprising a shielding electrode disposed on the second source metal layer to overlap the second sensor transistor without overlapping the fourth sensor transistor.

9. The fingerprint sensor of claim 8, further comprising:
a hole transporting layer disposed on the shielding electrode to overlap the first to fourth sensor transistors;
an electron transporting layer disposed on the hole transporting layer to overlap the first to fourth sensor transistors; and
a common electrode disposed on the electron transporting layer to overlap the first to fourth sensor transistors.

10. The fingerprint sensor of claim 6,
wherein a gate electrode of the fourth sensor transistor comprises a hole exposing a portion of a semiconductor region to a reflected light.

11. A display device comprising:
a pixel disposed in an emission area and comprising a light emitting element; and
a fingerprint sensor disposed in a sensor area,
wherein the fingerprint sensor comprises:
a read-out line disposed on a substrate and extending in a first direction;

a first sensor transistor controlling a sensing current based on a voltage of a sensor node;

a second sensor transistor supplying a reset voltage to the sensor node based on a reset signal;

a third sensor transistor electrically connecting a first electrode of the first sensor transistor and the read-out line based on a first gate signal;

a fourth sensor transistor comprising a gate electrode connected to a leakage voltage line to receive a leakage voltage, a first electrode connected to a bias voltage line to receive a bias voltage smaller than the leakage voltage, and a second electrode connected to the sensor node, and wherein a leakage current which flows through the fourth sensor transistor in proportion to the amount of light is applied to the sensor node to increase the voltage of the sensor node;

a first active layer disposed on the substrate and comprising a semiconductor region of each of the first sensor transistor, the third sensor transistor, and the fourth sensor transistor;

a first gate layer disposed on the first active layer;

a second gate layer disposed on the first gate layer;

a second active layer disposed on the second gate layer and comprising a semiconductor region of the second sensor transistor;

a third gate layer disposed on the second active layer;

a first source metal layer disposed on the third gate layer; and a second source metal layer disposed on the first source metal layer.

12. The display device of claim 11, wherein the pixel comprises:

a first transistor controlling a driving current flowing through the light emitting element;

a second transistor supplying a data voltage to a first electrode of the first transistor based on the first gate signal;

a third transistor electrically connecting a second electrode and a gate electrode of the first transistor based on a second gate signal; and a fourth transistor discharging the gate electrode of the first transistor to a first initialization voltage based on a third gate signal.

13. The display device of claim 12, wherein the semiconductor region of each of the first transistor and the second transistor contains a silicon-based material, and the semiconductor region of each of the third transistor and the fourth transistor contains an oxide-based material.

14. The display device of claim 12, wherein the pixel further comprises:

a fifth transistor supplying a driving voltage to the first electrode of the first transistor based on an emission signal;

a sixth transistor electrically connecting the second electrode of the first transistor and the light emitting element based on the emission signal; and a seventh transistor discharging a first electrode of the light emitting element to a second initialization voltage based on a fourth gate signal.

15. The display device of claim 11, wherein the light emitting element comprises:

a pixel electrode disposed on the second source metal layer;

a hole transporting layer disposed on the pixel electrode and implemented as a common layer of the emission area and the sensor area;

a light emitting layer disposed on the hole transporting layer;

an electron transporting layer disposed on the light emitting layer and implemented as a common layer of the emission area and the sensor area; and a common electrode disposed on the electron transporting layer.

16. The fingerprint sensor of claim 15, wherein the fingerprint sensor comprises a shielding electrode disposed on the same layer as the pixel electrode to overlap the second sensor transistor without overlapping the fourth sensor transistor.

17. The fingerprint sensor of claim 11, wherein a gate electrode of the fourth transistor comprises a hole exposing a portion of a semiconductor region to a reflected light.

* * * * *